(12) United States Patent
Mitsui

(10) Patent No.: US 10,772,187 B2
(45) Date of Patent: Sep. 8, 2020

(54) ELECTRONIC EQUIPMENT AND ELECTRONIC DEVICE

(71) Applicant: NEC Corporation, Tokyo (JP)

(72) Inventor: Tomoyuki Mitsui, Tokyo (JP)

(73) Assignee: NEC CORPORATION, Minato-ku, Tokyo (JP)

( * ) Notice: Subject to any disclaimer, the term of this patent is extended or adjusted under 35 U.S.C. 154(b) by 0 days.

(21) Appl. No.: 16/260,636

(22) Filed: Jan. 29, 2019

(65) Prior Publication Data
US 2019/0269004 A1    Aug. 29, 2019

(30) Foreign Application Priority Data

Feb. 23, 2018   (JP) .................................. 2018-030924

(51) Int. Cl.
*H05K 7/20* (2006.01)
*H05K 1/02* (2006.01)
*H05B 3/26* (2006.01)
*H05K 7/14* (2006.01)

(52) U.S. Cl.
CPC ............. *H05K 1/0201* (2013.01); *H05B 3/26* (2013.01); *H05K 1/0203* (2013.01); *H05K 1/0271* (2013.01); *H05K 7/203* (2013.01); *H05K 7/208* (2013.01); *H05K 7/20409* (2013.01); *H05K 7/1488* (2013.01); *H05K 2201/064* (2013.01)

(58) Field of Classification Search
None
See application file for complete search history.

(56) References Cited

U.S. PATENT DOCUMENTS

| 4,649,990 | A | * | 3/1987 | Kurihara | ............. H01L 23/3731 165/185 |
| 4,944,401 | A | * | 7/1990 | Groenewegen | ...... H05K 5/0213 174/544 |
| 8,525,323 | B2 | * | 9/2013 | Yamazaki | ................. G01J 5/04 257/414 |
| 9,648,769 | B2 | * | 5/2017 | Tramet | ................. H05K 7/1432 |
| 9,711,432 | B2 | * | 7/2017 | Riou | ........................ H01L 23/44 |

(Continued)

FOREIGN PATENT DOCUMENTS

| JP | 59-188198 A | 10/1984 |
| JP | 10-303586 A | 11/1998 |

(Continued)

OTHER PUBLICATIONS

Communication dated Apr. 16, 2019 from Japanese Patent Office in counterpart JP Application No. 2018-030924.

*Primary Examiner* — Courtney L Smith
(74) *Attorney, Agent, or Firm* — Sughrue Mion, PLLC

(57) ABSTRACT

Electronic equipment 100 includes a circuit board 10, a first housing 20, and a deformation suppressing portion 30. A heating element H is mounted on the circuit board 10. The first housing 20 is mounted on a first main surface 11 of the circuit board 10 in such a way that the heating element H and a coolant COO are sealed with respect to the first main surface 11. The deformation suppressing portion 30 suppresses deformation of the circuit board 10. According to this configuration, it is possible to suppress a failure such as leakage of a coolant and cutting of a wiring formed on a circuit board, even when a heating element and a coolant are sealed in a space surrounded by the circuit board and a housing.

7 Claims, 32 Drawing Sheets

(56) References Cited

U.S. PATENT DOCUMENTS

| | | | | |
|---|---|---|---|---|
| 2002/0150740 A1* | 10/2002 | Chung | ............... | B29C 66/114 |
| | | | | 428/201 |
| 2009/0291200 A1* | 11/2009 | Bedinger | ............ | H01L 23/3192 |
| | | | | 427/96.2 |
| 2017/0030654 A1* | 2/2017 | Yang | ................... | F28D 15/046 |
| 2018/0199465 A1* | 7/2018 | Metzler | ............. | H05K 7/20936 |

FOREIGN PATENT DOCUMENTS

| | | |
|---|---|---|
| JP | 2000-349480 A | 12/2000 |
| JP | 2012-531056 A | 12/2012 |
| JP | 2013-187251 A | 9/2013 |
| WO | 2010/084717 A1 | 7/2010 |

\* cited by examiner

ELECTRONIC EQUIPMENT AND ELECTRONIC DEVICE

This application is based upon and claims the benefit of priority from Japanese Patent Application No. 2018-030924, filed on Feb. 23, 2018, the disclosure of which is incorporated herein in its entirety by reference.

TECHNICAL FIELD

The present invention relates to electronic equipment and the like, and relates to a technique for electronic equipment and the like which cool a heating element, for example.

BACKGROUND ART

In recent years, an information processing amount is increasing, accompanied by development of technology such as a cloud service. In order to process such an enormous amount of information, a calculation amount of a heating element such as a central processing unit (CPU) and a multi-chip module (MCM) tends to increase. Therefore, an amount of heat generation of these heating elements also tends to increase. Accompanied by this tendency, an effort to more efficiently cool a heating element is being carried out every day.

As a cooling technique of a heating element, electronic equipment for cooling a heating element by using a coolant is known (e.g. PTLs 1 and 2).

In a technique described in PTL 1 (Japanese translation of PCT International Application Publication No. 2012-531056), a heating element (a heating electronic device 510) is mounted on a circuit board (a printed circuit board 540). A housing (a module casing 530, an uppermost wall 571 of a housing) accommodates the heating element, and is mounted on one surface of the circuit board in such a way as to seal a coolant (a dielectric cooling liquid 532) with respect to the one surface of the circuit board.

Further, two pumps (impingement cooling type immersible pumps 535 and 536) are disposed in the coolant within the housing and circulate the coolant. Further, a cooling mechanism (a liquid cooling cold plate 420) is mounted on an upper surface of the housing (the uppermost wall 571 of the housing). In the cooling mechanism, a coolant different from the coolant within the housing flows from a suction port toward a discharge port.

In this way, in the technique described in PTL 1, the heating element is cooled by circulating the coolant in the housing, and flowing a coolant different from the coolant in the housing within the cooling mechanism.

In a technique described in PTL 2 (Japanese Unexamined Patent Application Publication No. S59-188198), at least a part of a heating component is incorporated in an electronic circuit package. Further, a cover is formed in such a way that a sealing container in which the cover serves as a part of a wall of a component mounting surface of the package is constituted, and the heating component is immersed by injecting a cooling liquid into the cover.

Note that a technique related to the present invention is also disclosed in PTL 3 (Japanese Unexamined Patent Application Publication No. 2013-187251).

However, in the techniques described in PTLs 1 and 2, a housing is mounted on one surface of a circuit board in such a way that a heating element is accommodated and a coolant is sealed with respect to the one surface of the circuit board. Specifically, a coolant and a heating element are sealed in a space surrounded by one surface of a circuit board and a housing. When a temperature of a heating element increases, an inner pressure of the above-described sealed space increases, and deformation such as deflection may occur in the circuit board. When the deformation increases, there occurs a problem that a wiring formed on the circuit board may be cut, a gap may be formed in a connection portion between the circuit board and the housing, thereby causing leakage of a coolant, or the like.

SUMMARY

An object of the present invention is to provide electronic equipment and the like which enable to suppress a failure such as leakage of a coolant or cutting of a wiring formed on a circuit board, even when a heating element and the coolant are sealed in a space surrounded by the circuit board and a housing.

BRIEF DESCRIPTION OF THE DRAWINGS

Exemplary features and advantages of the present invention will become apparent from the following detailed description when taken with the accompanying drawings in which.

First Example Embodiment

A configuration of electronic equipment 100 in a first example embodiment of the present invention is described, based on the drawings.

Figure 1:
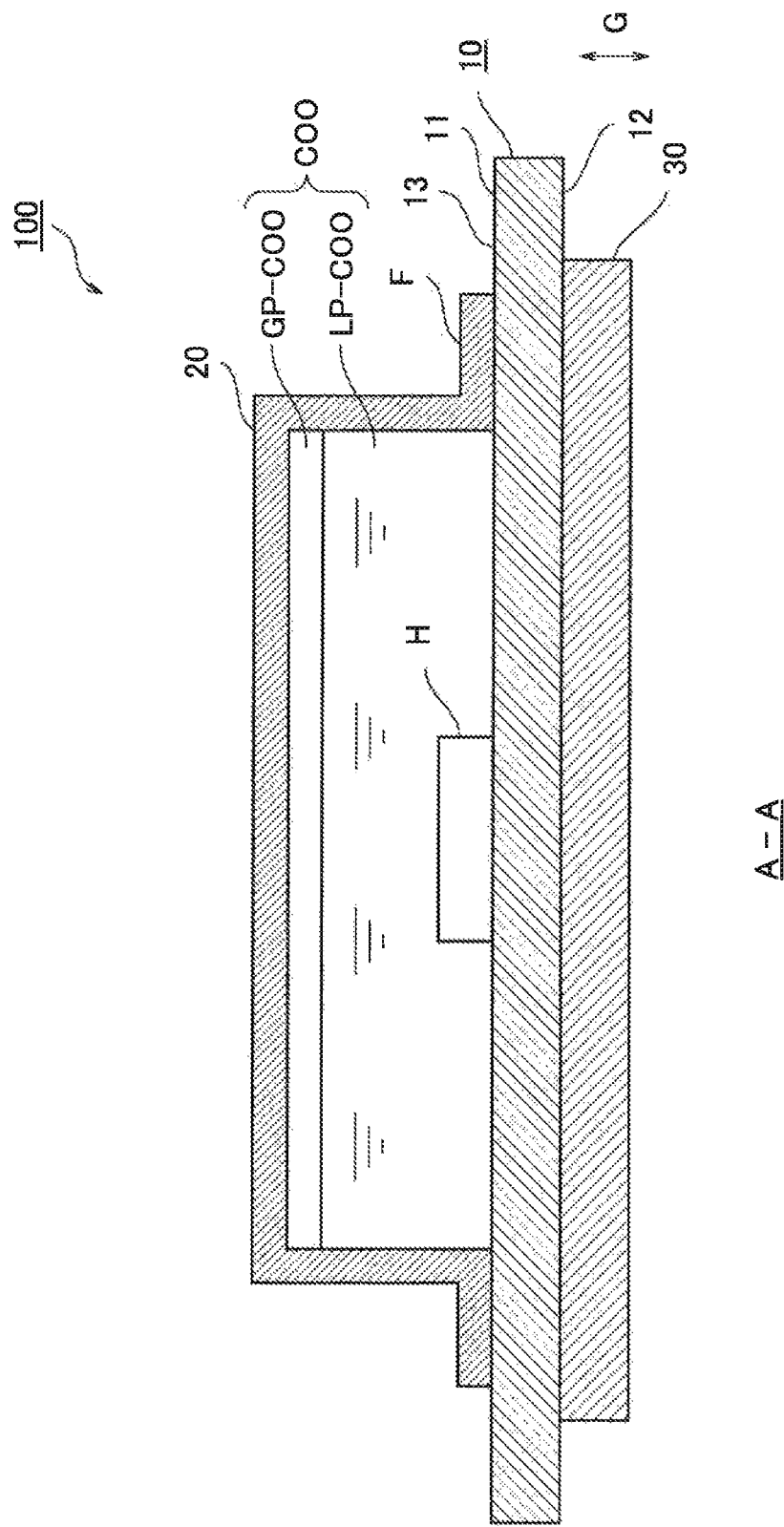
FIG. 1 is a cross-sectional view illustrating a configuration of electronic equipment in a first example embodiment of the present invention, and is a diagram illustrating a cross section taken along the plane A-A in FIG. 4.
Figure 2:
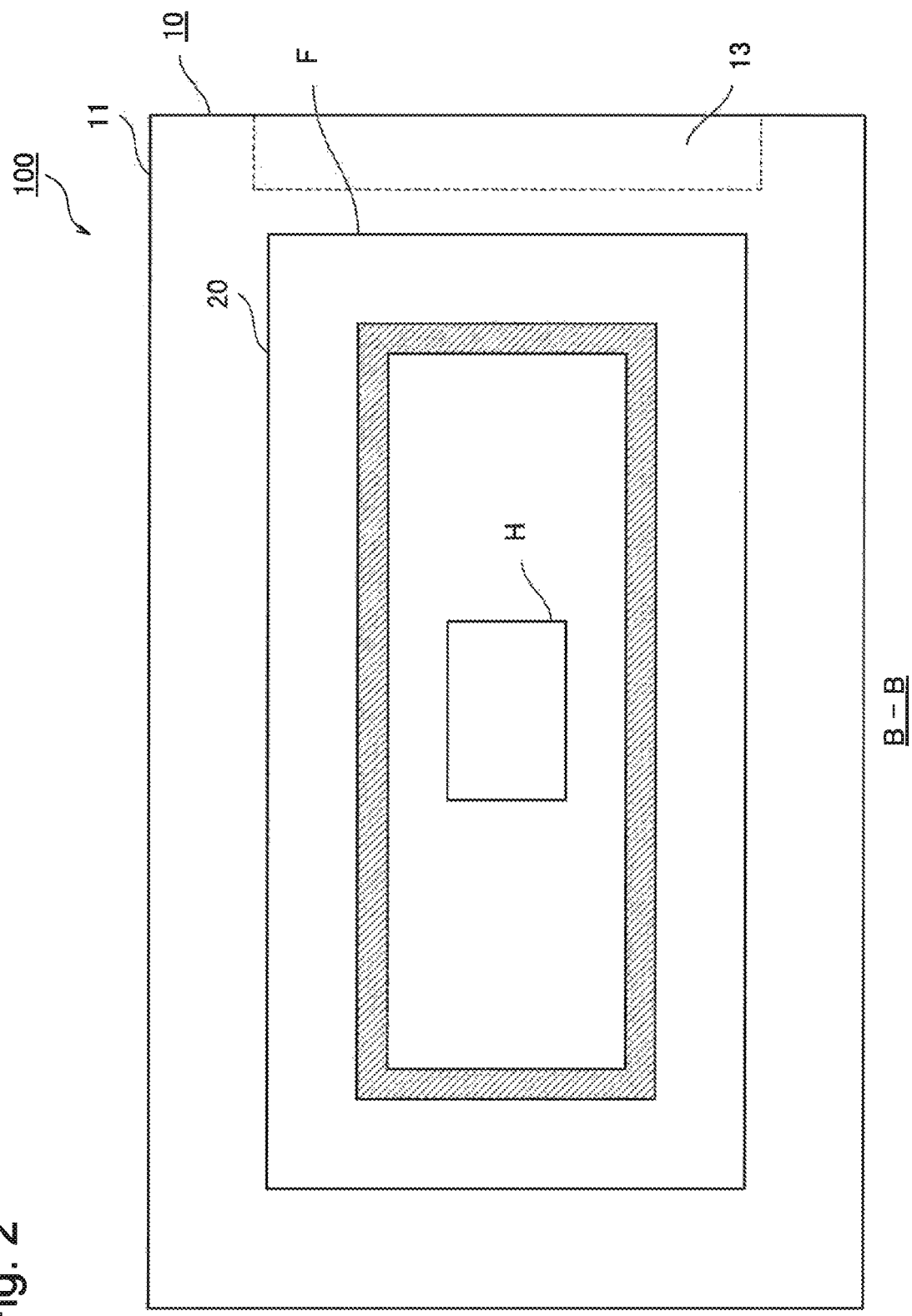
FIG. 2 is a cross-sectional view illustrating a configuration of the electronic equipment in the first example embodiment of the present invention, and is a diagram illustrating a cross section taken along the plane B-B in FIG. 3.
Figure 3:
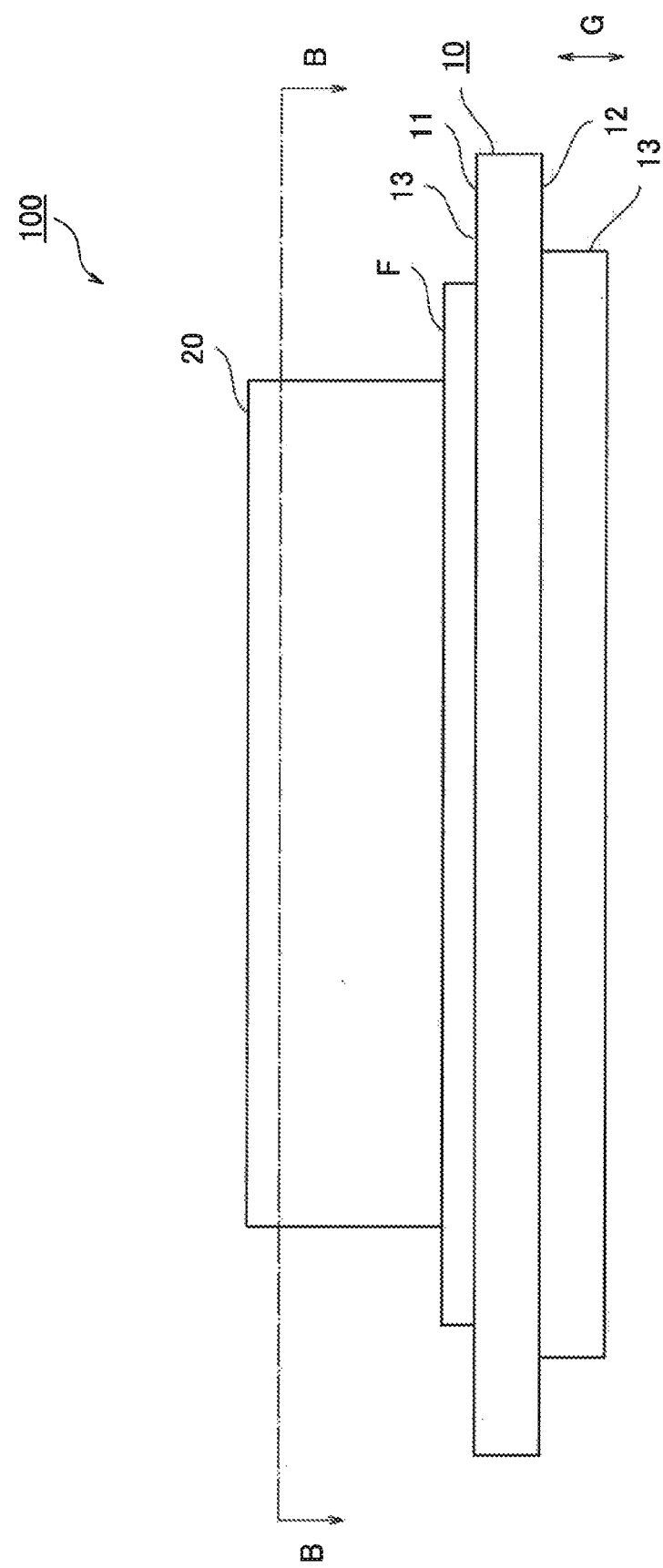
FIG. 3 is a side view illustrating a configuration of the electronic equipment in the first example embodiment of the present invention.
Figure 4:
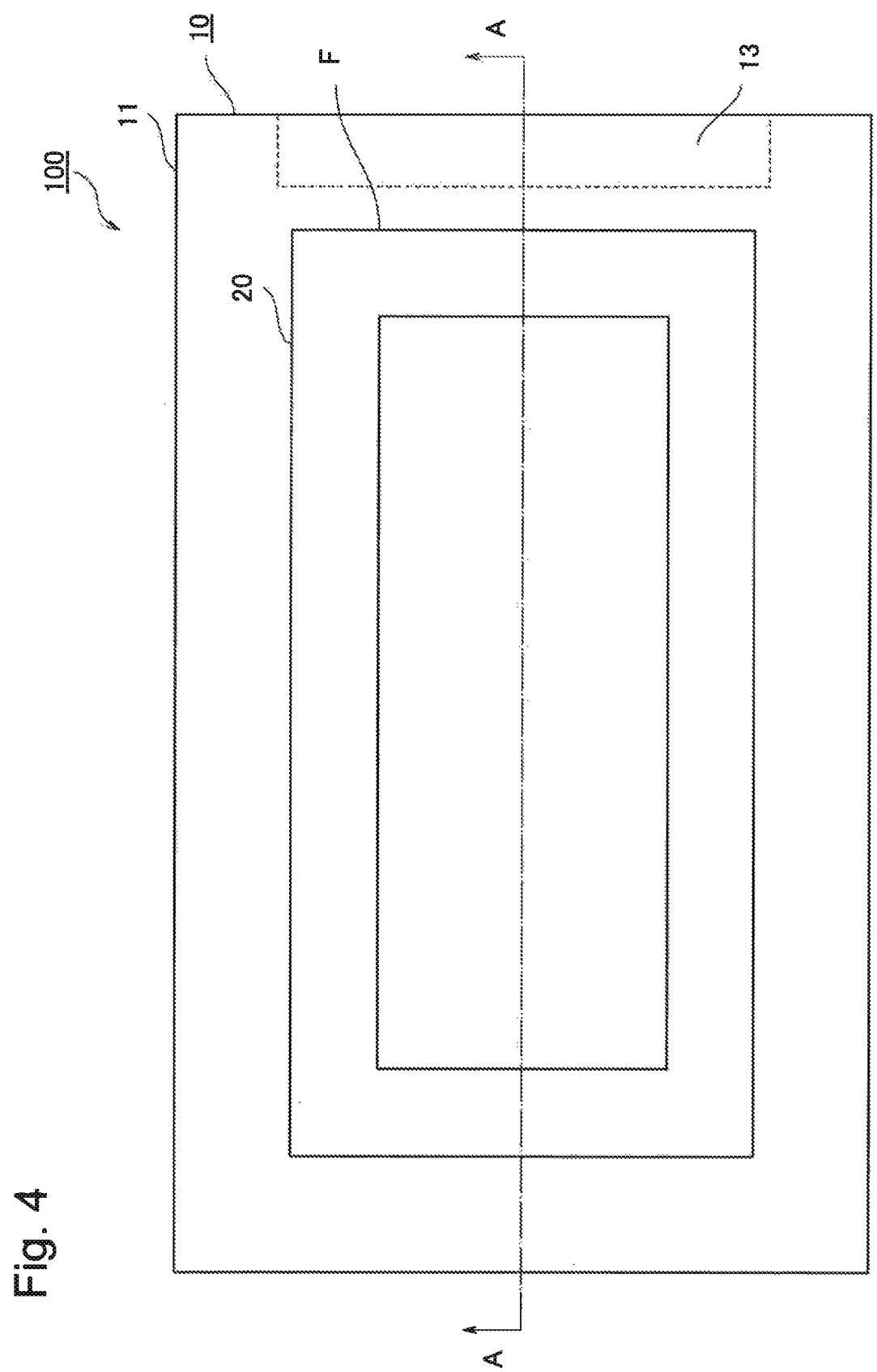
FIG. 4 is a top plan view illustrating a configuration of the electronic equipment in the first example embodiment of the present invention.

FIG. 1 is a cross-sectional view illustrating a configuration of the electronic equipment 100, and is a diagram illustrating a cross section taken along the plane A-A in FIG. 4. FIG. 2 is a a cross-sectional view illustrating a configuration of the electronic equipment 100, and is a diagram illustrating a cross section taken along the plane B-B in FIG. 3. FIG. 3 is a side view illustrating a configuration of the electronic equipment 100. FIG. 4 is a top plan view illustrating a configuration of the electronic equipment 100. Note that, in FIGS. 1 and 3, a vertical direction G is illustrated.

Referring to FIGS. 1 to 4, the electronic equipment 100 includes a circuit board 10, a first housing 20, and a deformation suppressing portion 30. Note that the electronic equipment 100 may be used as an electronic module to be incorporated in a communication device, a server, and the like, for example.

The circuit board 10 is formed into a flat plate shape. The circuit board 10 includes a first main surface 11, a second main surface 12, and a connector portion 13. Herein, a main surface of the circuit board 10 is a main surface of the circuit board 10, and is a surface where an electronic component is mounted, for example. Note that the first main surface 11 may be referred to as an outer surface (front surface) of the circuit board, and the second main surface 12 may be referred to as a back surface of the circuit board. A heating element H is mounted on the first main surface 11 of the circuit board 10. Note that a flow regulating plate (not illustrated) for regulating a flow of a coolant COO may be mounted on the circuit board 10. The flow regulating plate may be mounted on an inner surface of the first housing 20.

Note that the heating element H is a component which generates heat when being operated, and is, for example, a central processing unit (CPU), a multi-chip module (MCM), and the like. In description of the present example embodiment, it is assumed that the number of heating elements H is one, but a plurality of heating elements H may be provided.

The circuit board 10 is, for example, a printed wiring board. A printed wiring board is constituted by laminating a plurality of insulating substrates and a conductive wiring. Further, a conductive pad for mounting an electronic component is formed on the first main surface 11 and the second main surface 12 of the circuit board 10. As a material of an insulating substrate, for example, glass epoxy resin is used. A conductive wiring and a conductive pad are formed of a copper film, for example.

Further, the connector portion 13 is formed on the first main surface 11 of the circuit board 10 for connection to another electronic component (not illustrated). The connector portion 13 is constituted of a plurality of terminals formed on the first main surface 11 of the circuit board 10. Note that the connector portion 13 may also be formed on the second main surface 12. In this case, the connector portion 13 is formed in an area of the second main surface 12, which is associated with a forming area of the connector portion 13 formed on the first main surface 11.

As illustrated in FIG. 1, the first housing 20 is mounted on the first main surface 11 in such a way that the heating element H and a coolant (hereinafter, referred to as COO) are sealed with respect to the first main surface 11 of the circuit board 10. Further, the first housing 20 is mounted on the first main surface 11 in such a way as not to cover the connector portion 13.

The first housing 20 accommodates the coolant COO and the heating element H with respect to the circuit board 10. Further, the first housing 20 includes a flange portion F. As illustrated in FIG. 1, the flange portion F is formed in such a way as to project from an outer periphery of a lateral surface of the first housing 20. As a material of the first housing 20, a thermal conductive material is used, and aluminum, aluminum alloy, or the like is used, for example.

Note that the first housing 20 is mounted on the first main surface 11 by an adhesive agent, a screw, or the like, for example. At this occasion, the flange portion F of the first housing 20, and the first main surface 11 of the circuit board 10 are joined by an adhesive agent, a screw, or the like.

Note that, preferably, a rubber-like packing (not illustrated) or the like is interposed, as an elastic member, between the flange portion F of the first housing 20 and the first main surface 11 of the circuit board 10. Thus, it is possible to suppress formation of a gap between the flange portion F of the first housing 20 and the first main surface 11 of the circuit board 10. Consequently, it is possible to suppress leakage of the coolant COO from between the flange portion F of the first housing 20 and the first main surface 11 of the circuit board 10.

Further, a grease may be interposed between the flange portion F of the first housing 20 and the first main surface 11 of the circuit board 10. Thus, similarly to a case where a rubber-like packing or the like is interposed, it is possible to suppress formation of a gap between the flange portion F of the first housing 20 and the first main surface 11 of the circuit board 10.

Note that the flange portion F is not an essential element, and may be omitted. In this case, a lower side end portion (a lower side end portion on the plane of FIG. 1) of a lateral surface of the first housing 20 in the vertical direction G, and the first main surface 11 of the circuit board 10 are joined by an adhesive agent or the like.

As the coolant COO, a coolant in which the phase changes between a coolant in a liquid phase (liquid-phase coolant, hereinafter, referred to as LP-COO), and a coolant in a gas phase (gas-phase coolant, hereafter, referred to as GP-COO) is used.

Hydro fluorocarbon (HFC), hydro fluoroether (HFE), or the like may be used for the coolant COO, for example, as a coolant having a low boiling point. Further, as the coolant COO, a material in which the phase does not change such as water may be used, for example.

The coolant COO is sealed in a sealed state in a space between the first housing 20 and the circuit board 10. Therefore, the pressure of a space between the first housing 20 and the circuit board 10 is constantly kept to a saturated steam pressure of a coolant by injecting a liquid-phase coolant LP-COO into the space between the first housing 20 and the circuit board 10, followed by evacuation. Note that a method for filling the space between the first housing 20 and the circuit board 10 with the coolant COO will be described later in detail in description of a manufacturing method of the electronic equipment 100.

The deformation suppressing portion 30 is a plate member. The deformation suppressing portion 30 is mounted on the second main surface 12 of the circuit board 10. Thus, it is possible to form plywood by the circuit board 10 and the deformation suppressing portion 30. Generally, an allowable stress of the plywood is made large, as compared to a configuration made only of the circuit board 10. Consequently, it is possible to suppress deformation of the circuit board 10 due to the weight or a pressure of the coolant COO. At this occasion, more preferably, as illustrated in FIG. 1, an area where the coolant COO between the first housing 20 and the circuit board 10 comes into contact with the circuit board 10 is included in an area where the deformation suppressing portion 30 and the circuit board 10 face each other. Thus, it is possible to further suppress deformation of the circuit board 10. Note that, as will be described later in detail in description of another example embodiment, the deformation suppressing portion 30 may be mounted on the first main surface 11 of the circuit board 10. The deformation suppressing portion 30 is mounted on the circuit board 10 by an adhesive agent, a screw, or the like, for example.

As a material of the deformation suppressing portion 30, iron, stainless alloy, or the like is used, for example. Further, the deformation suppressing portion 30 is formed in such a way that at least rigidity capable of withstanding a pressure generated when the coolant COO turns from a liquid-phase coolant LP-COO to a gas-phase coolant GP-COO by phase change is secured, as the weights of the coolant COO, the heating element H, the first housing 20, and the like are added.

A configuration of the electronic equipment 100 is described as above.

Next, a manufacturing method of the electronic equipment 100 is described.

First, the circuit board 10 on which the heating element H is mounted is prepared. Next, the first housing 20 is mounted to the first main surface 11 of the circuit board 10 by an adhesive agent, a screw, or the like. Further, the deformation suppressing portion 30 is mounted on the second main surface 12. Furthermore, the coolant COO is filled in a space between the first housing 20 and the circuit board 10.

A method for filling the space between the first housing 20 and the circuit board 10 with the coolant COO is as follows.

The coolant COO is injected into the space between the first housing 20 and the circuit board 10 through a coolant injection hole (not illustrated), which is formed in advance in an upper surface of the first housing 20 (a surface on the upper side on the plane of FIG. 1). Then, the coolant injection hole is closed. Further, air is ejected from the space between the first housing 20 and the circuit board 10 by using a vacuum pump (not illustrated) or the like via an air ejection hole (not illustrated), which is formed in advance in the upper surface of the first housing 20 (a surface on the upper side on the plane of FIG. 1). Then, the air ejection hole is closed. In this way, the coolant COO is sealed in the space between the first housing 20 and the circuit board 10. Thus, the pressure of the space between the first housing 20 and the circuit board 10 becomes equal to a saturated steam pressure of the coolant COO, and a boiling point of the coolant COO sealed in the space between the first housing 20 and the circuit board 10 approaches a room temperature. Note that the coolant injection hole may also be used as the air ejection hole.

A manufacturing method of the electronic equipment 100 is described as above.

Figure 5:
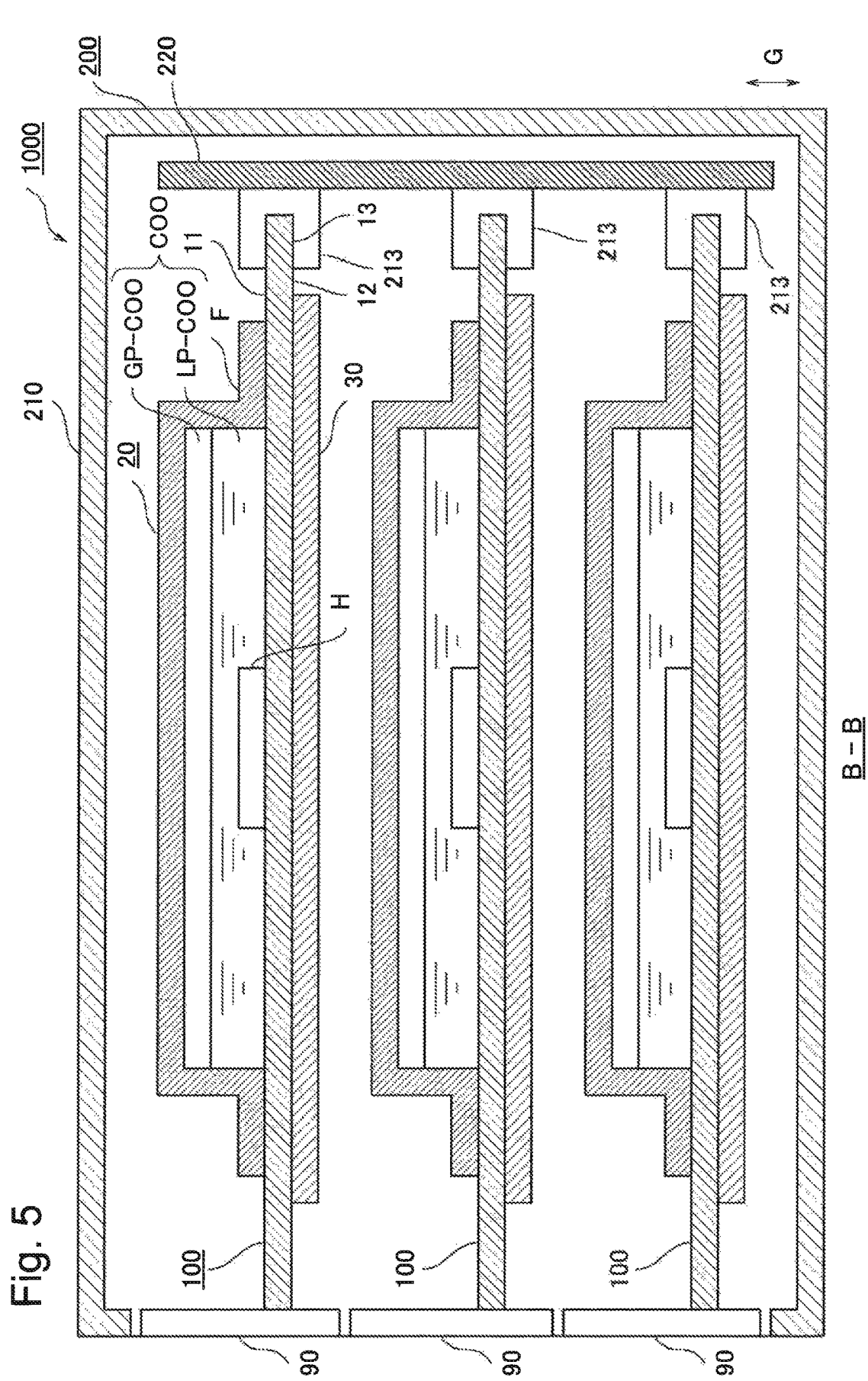
FIG. 5 is a cross-sectional view illustrating a configuration of the electronic equipment in the first example embodiment of the present invention, and is a diagram illustrating a cross section taken along the plane B-B in FIG. 7.
Figure 6:
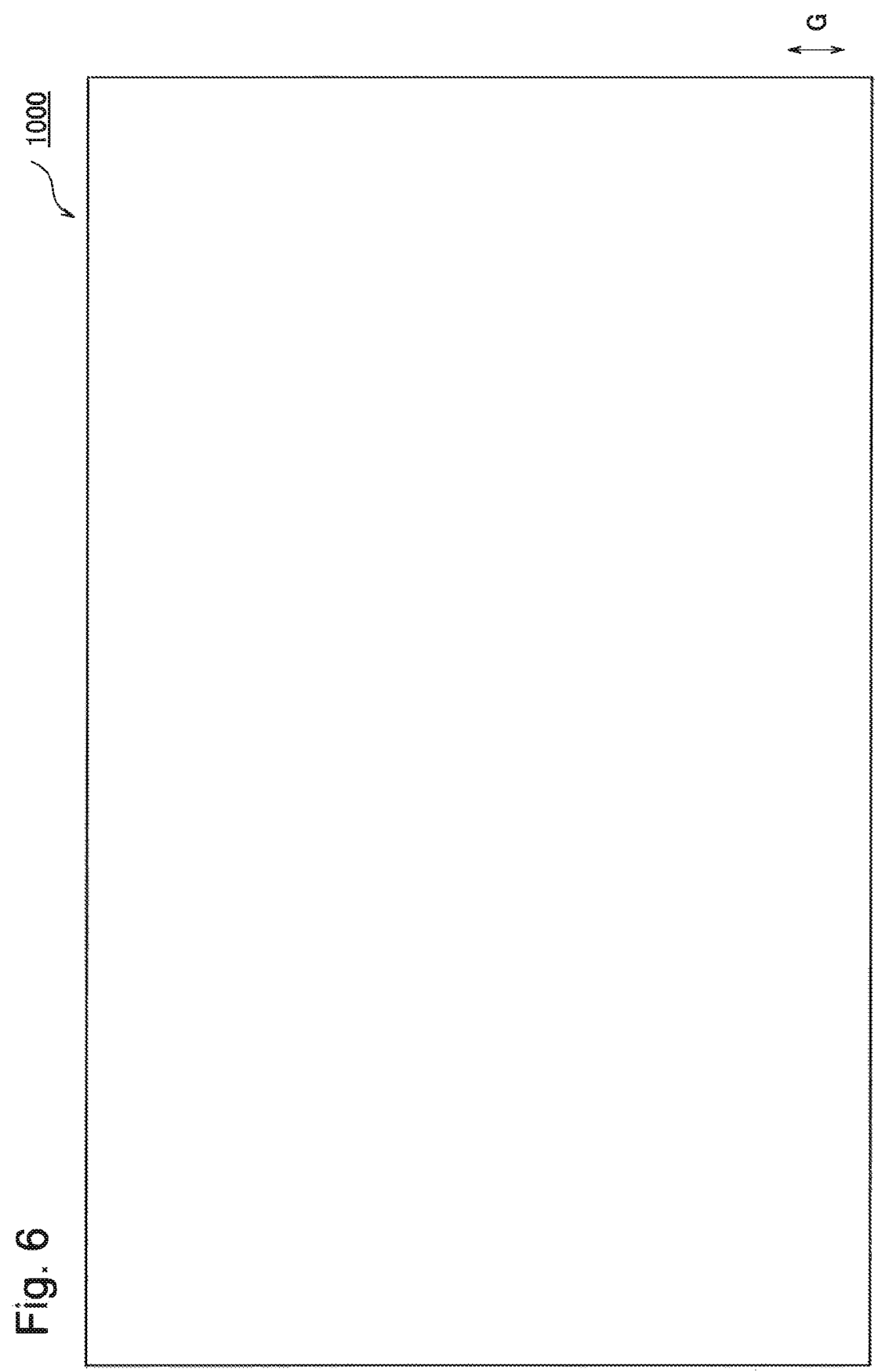
FIG. 6 is a side view illustrating a configuration of the electronic equipment in the first example embodiment of the present invention.
Figure 7:
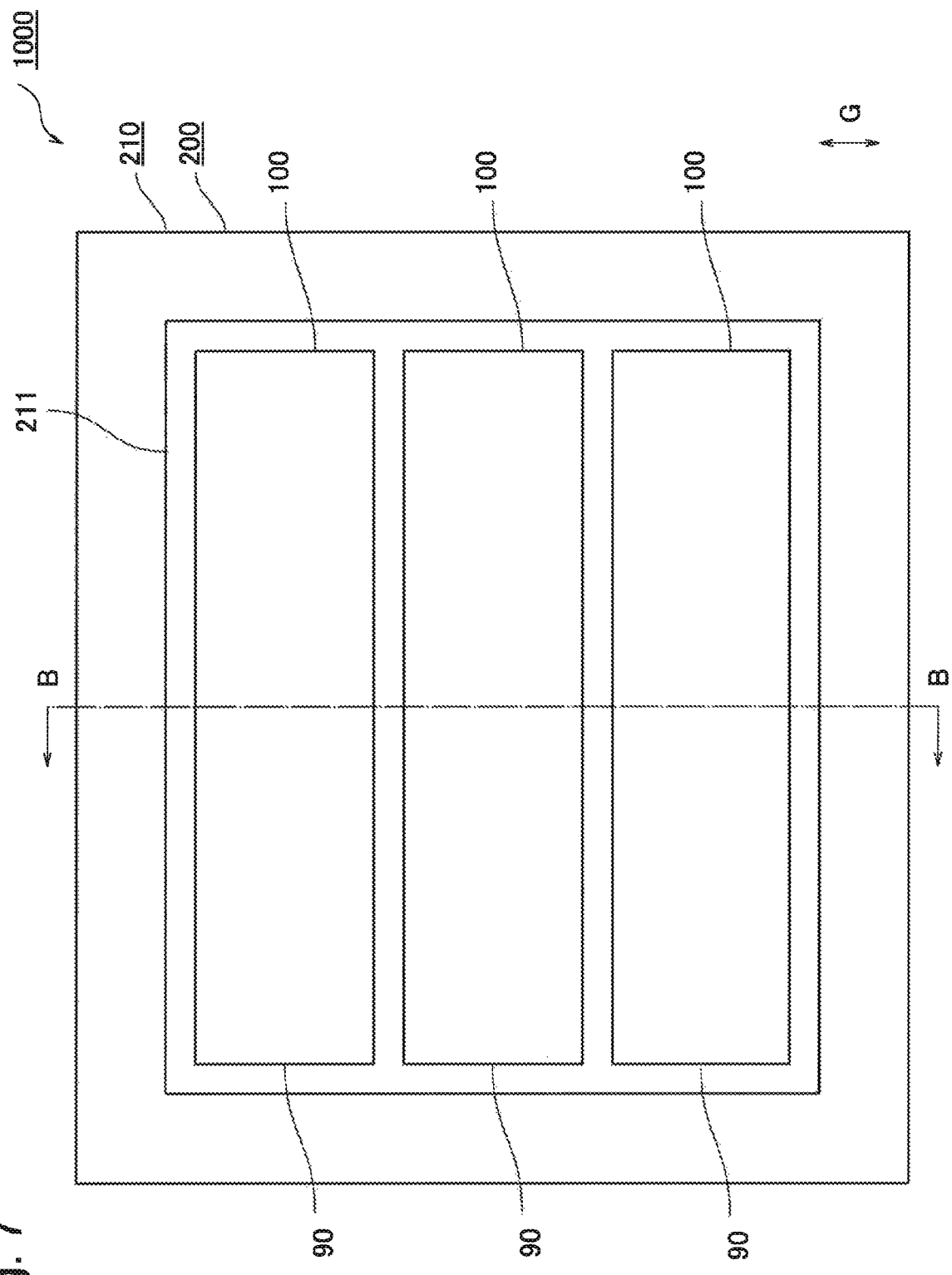
FIG. 7 is a front view illustrating a configuration of the electronic equipment in the first example embodiment of the present invention.

Next, a configuration of an electronic device 1000 in the first example embodiment of the present invention is described. FIG. 5 is a cross-sectional view illustrating a configuration of the electronic device 1000, and is a diagram illustrating a cross section taken along the section B-B in FIG. 7. FIG. 6 is a side view illustrating a configuration of the electronic device 1000. FIG. 7 is a front view illustrating a configuration of the electronic device 1000. Note that, in FIGS. 5 to 7, a vertical direction G is illustrated.

Referring to FIGS. 5 to 7, the electronic device 1000 includes the electronic equipment 100 and an accommodation rack 200. Note that the electronic device 1000 is a communication device, a server, or the like, for example. The electronic equipment 100 (such as an electronic module) is incorporated in the electronic device 1000.

As illustrated in FIG. 5, the accommodation rack 200 accommodates a plurality of pieces of electronic equipment 100. In FIG. 5, three pieces of electronic equipment 100 are accommodated in the accommodation rack 200. The number of pieces of electronic equipment, however, is not limited to three, and one or a plurality of pieces of electronic equipment 100 may be accommodated in the accommodation rack 200.

Note that, herein, as illustrated in FIGS. 5 and 7, a front cover 90 is mounted on an end portion of the circuit board 10 of the electronic equipment 100 that is a side opposite to the connector portion 13. Note that the front cover 90 is not an essential constituent element of the present example embodiment.

Figure 8:
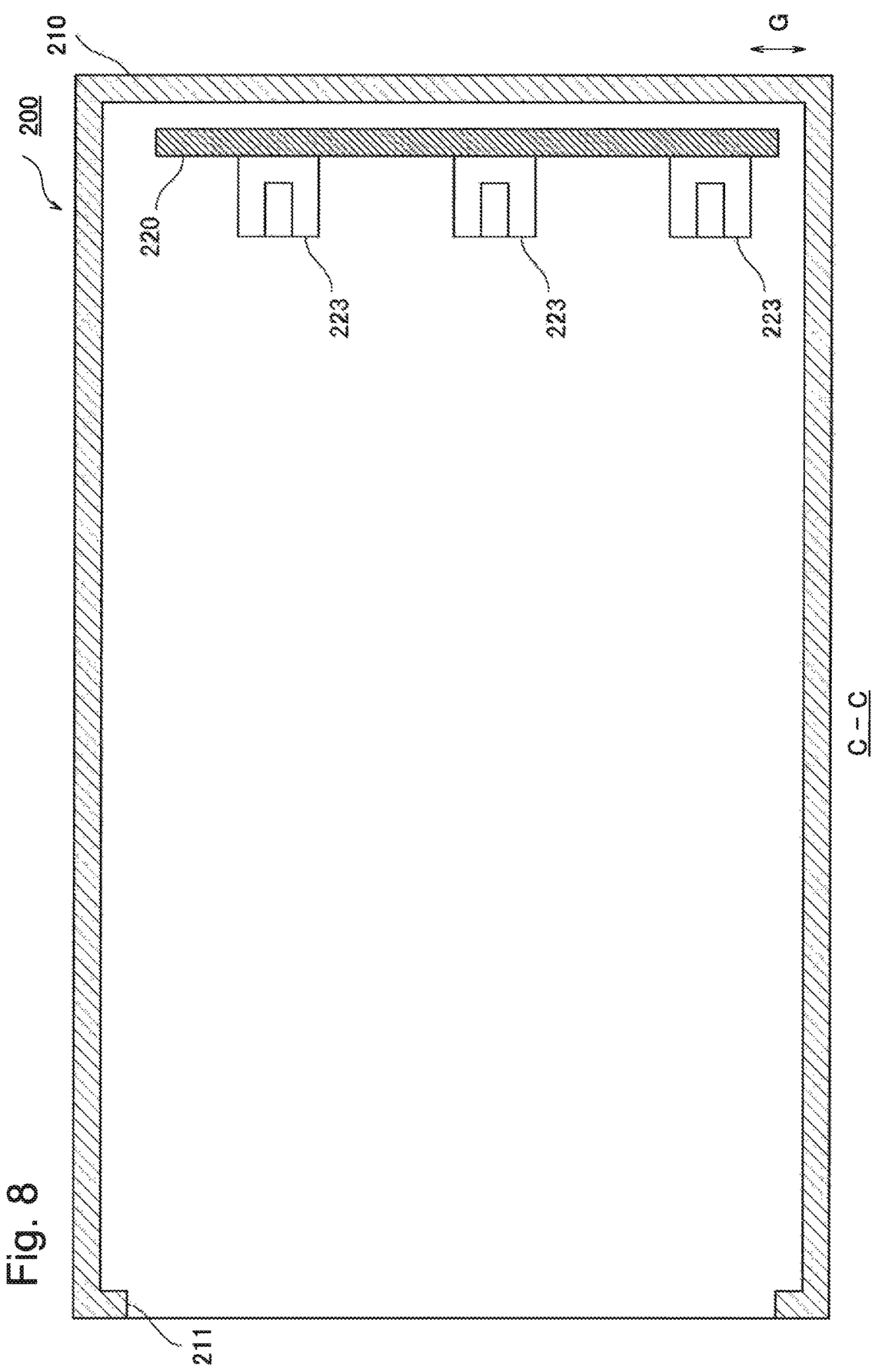
FIG. 8 is a cross-sectional view illustrating a configuration of an accommodation rack in the first example embodiment of the present invention, and is a diagram illustrating a cross section taken along the plane C-C in FIG. 9.
Figure 9:
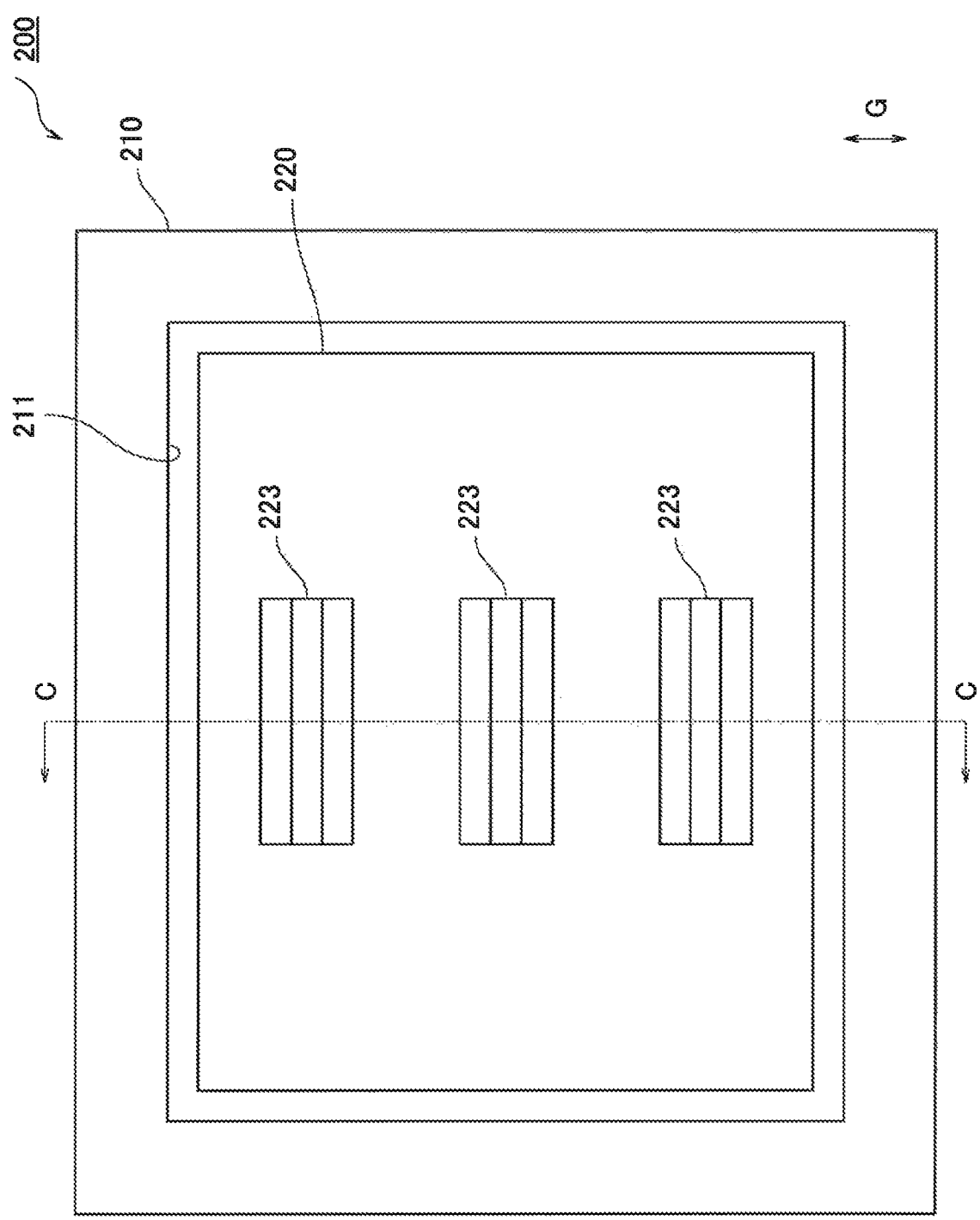
FIG. 9 is a front view illustrating a configuration of the accommodation rack in the first example embodiment of the present invention.

A configuration of the accommodation rack 200 is described specifically. FIG. 8 is a cross-sectional view illustrating a configuration of the accommodation rack 200, and is a diagram illustrating a cross section taken along the section C-C in FIG. 9. FIG. 9 is a front view illustrating a configuration of the accommodation rack 200. Note that, in FIGS. 8 and 9, a vertical direction G is illustrated.

As illustrated in FIGS. 8 and 9, the accommodation rack 200 includes a housing 210 and a circuit board 220.

The housing 210 is formed into a box shape, with an inside thereof being hollow. The housing 210 accommodates the circuit board 220. The housing 210 includes an opening portion 211. The opening portion 211 is formed on the front surface side of the accommodation rack 200. The circuit board 220 and the electronic equipment 100 are accommodated in the housing 210 via the opening portion 211. As a material of the opening portion 210, aluminum, aluminum alloy, stainless alloy, or the like is used, for example.

The circuit board 220 is fixed to the inside of the housing 210 on the back side by a screw or the like. The circuit board 220 is disposed along the vertical direction G. Further, as illustrated in FIG. 8, an accommodation-rack-side connector portion 223 is mounted on the circuit board 220. The accommodation-rack-side connector portion 223 is formed in such a way as to fit with the connector portion 13. Specifically, a thickness of the circuit board 10 at a position where the connector portion 13 is disposed, and a width of a portion of the accommodation-rack-side connector portion 223 for accommodating the connector portion 13 are set to be substantially equal to each other. Further, a pitch distance between terminals (not illustrated) formed on the connector portion 13, and a distance between terminals (not illustrated) of the accommodation-rack-side connector portion 223 are set to be substantially equal to each other.

A configuration of the accommodation rack 200 is described as above.

Next, an operation of the electronic device 1000 is described. As illustrated in FIG. 5, the electronic equipment 100 is accommodated in the housing 210 of the accommodation rack 200. At this occasion, the connector portion 13 of the electronic equipment 100 is inserted in the accommodation-rack-side connector portion 223 of the accommodation rack 200. Thus, the connector portion 13 is fitted with the accommodation-rack-side connector 223. Consequently, the connector portion 13 and the accommodation-rack-side connector portion 223 are electrically connected. Further, the circuit board 220 of the accommodation rack 200 and the circuit board 10 of the electronic equipment 100 are electrically connected via the connector portion 13 and the accommodation-rack-side connector portion 223.

Next, when the electronic device 1000 is activated, electric power is supplied from the circuit board 220 to the heating element H on the circuit board 10 via the connector portion 13 and the accommodation-rack-side connector portion 223. Thus, the heating element H generates heat.

A liquid-phase coolant LP-COO is boiled on a surface of the heating element H by heat of the heating element H, and turns to a gas-phase coolant GP-COO by phase change. Thus, air bubbles of the gas-phase coolant GP-COO are generated. The heat generated on the heating element H is dissipated by the heat of vaporization (latent heat) generated by the phase change. Consequently, the heating element H is cooled.

The gas-phase coolant GP-COO rises upward in the vertical direction G within the liquid-phase coolant LP-COO, escapes from a liquid surface of the liquid-phase coolant LP-COO, and further rises upward in the vertical direction G. Further, when the gas-phase coolant GP-COO boiled by the heat of the heating element H is cooled by contact with an inner wall surface of the first housing 20, the gas-phase coolant GP-COO turns to the liquid-phase coolant LP-COO again by phase change. The liquid-phase coolant LP-COO falls downward in the vertical direction G within the first housing 20, stays on the circuit board 10 side, and is used again for cooling the heating element H.

Next, an operation of the deformation suppressing portion 30 is described. As illustrated in FIG. 1, the circuit board 10 is formed on the lower side than the coolant COO in the vertical direction G. Therefore, the circuit board 10 is bent in such a way that a lower portion thereof in the vertical direction G projects by the weight of the coolant COO. Further, a pressure of the coolant COO in a sealed space between the first housing 20 and the circuit board 10 increases by phase change of the coolant COO from the liquid-phase coolant LP-COO to the gas-phase coolant GP-COO.

As described above, in the electronic equipment 100, the deformation suppressing unit 30 is mounted on the second main surface 12 of the circuit board 10. Therefore, it is possible to form plywood by the circuit board 10 and the deformation suppressing portion 30. Generally, an allowable stress of the plywood is made large, as compared to a configuration made only of the circuit board 10. Consequently, it is possible to suppress deformation of the circuit board 10 due to the weight or a pressure of the coolant COO, the heating element H, or the like. Further, since it is possible to suppress deformation of the circuit board 10, it is possible to suppress formation of a gap between the circuit board 10 and the first housing 20 at a joint portion between the circuit board 10 and the first housing 20.

Therefore, even when the heating element H and the coolant COO are sealed in a space surrounded by the circuit board 10 and the first housing 20, it is possible to suppress a failure such as leakage of the coolant COO or cutting of a wiring formed on the circuit board. Note that, generally, whereas the circuit board 10 is formed into a flat plate shape, the first housing 20 is formed three-dimensionally. Therefore, generally, the circuit board 10 has a low rigidity and is likely to be bent, as compared to the first housing 20.

An operation of the deformation suppressing portion 30 is described as above.

As described above, the electronic equipment 100 in the first example embodiment of the present invention includes the circuit board 10, the first housing 20, and the deformation suppressing portion 30. The heating element H is mounted on the circuit board 10. The first housing 20 is mounted on the first main surface 11 in such a way that the heating element H and the coolant COO are sealed with respect to the first main surface 11 of the circuit board 10. The deformation suppressing portion 30 suppresses deformation of the circuit board 10.

In this way, the deformation suppressing portion 30 suppresses deformation of the circuit board 10. Consequently, it is possible to suppress deformation of the circuit board 10 by the weight or a pressure of the coolant COO, the heating element H, or the like. Further, since it is possible to suppress deformation of the circuit board 10, it is possible to suppress formation of a gap between the circuit board 10 and the first housing 20 at a joint portion between the circuit board 10 and the first housing 20.

Therefore, according to the electronic equipment 100 in the first example embodiment of the present invention, even when the heating element H and the coolant COO are sealed in a space surrounded by the circuit board 10 and the first housing 20, it is possible to suppress a failure such as leakage of the coolant COO, cutting of a wiring formed on the circuit board, and the like.

Further, in the electronic equipment 100 in the first example embodiment of the present invention, it is possible to use a coolant COO capable of turning to the liquid-phase coolant LP-COO and the gas-phase coolant GP-COO by phase change.

Thus, since heat (latent heat) also migrates while the coolant COO undergoes phase change, it is possible to enhance cooling efficiency of the heating element H, as compared to a coolant which does not undergo phase change.

Further, the coolant COO which undergoes phase change has a large difference in pressure between a liquid phase state and a gas phase state. In particular, when the coolant COO which undergoes phase change turns from the liquid-phase coolant LP-COO to the gas-phase coolant GP-COO by phase change, a pressure of the coolant COO in a sealed space between the first housing 20 and the circuit board 10 greatly increases. Therefore, when the coolant COO which undergoes phase change is used, a pressure generated when the coolant COO undergoes phase change is applied to the circuit board 10, in addition to the weight of the coolant COO.

Therefore, when the coolant COO which undergoes phase change is used, the circuit board 10 is likely to be deformed, as compared to a case where a coolant which does not undergo phase change is used. On the other hand, as described above, in the electronic equipment 100, by forming the deformation suppressing portion 30, it is possible to suppress not only deformation of the circuit board 10 caused by the weight of the coolant COO, the heating element H, or the like, but also deformation of the circuit board 10 caused by a pressure generated by phase change of the coolant COO.

Further, in the electronic equipment 100 in the first example embodiment of the present invention, the deformation suppressing portion 30 may be a plate member mounted on one or both of the first main surface 11, and the second main surface 12 being a main surface of the circuit board that is a side opposite to the first main surface 11.

Thus, it is possible to provide an advantageous effect similar to the above-described advantageous effect.

Further, the electronic equipment 100 in the first example embodiment of the present invention further includes the connector portion 13. The connector portion 13 is formed on the first main surface 11 of the end portion of the circuit board 10, and is connected to another electronic component (e.g. the accommodation-rack-side connector 223). Further, the first housing 20 is mounted on the first main surface 11 in such a way as not to cover the connector portion 13. Specifically, the first housing 20 is mounted on a portion of the first main surface 11 other than a position where the connector portion 13 is mounted. Note that the connector portion 13 may not be formed on the first main surface 11, and may be formed on the second main surface 12.

Thus, the first housing 20 is mounted on the first main surface 11 of the circuit board 10 in such a way as not to interfere with the connector portion 13. Consequently, it is possible to prevent the first housing 20 from obstructing connection between another electronic component and the connector portion 13. Further, since it is possible to connect another electronic component and the connector portion 13 without dismounting the first housing 20, it is easy to perform a maintenance operation such as repair of an electronic component on the circuit board 10.

Further, the electronic device 1000 in the first example embodiment of the present invention includes the electronic equipment 100 and the accommodation rack 200. The electronic equipment 100 is mounted on the accommodation rack 200. Thus, it is possible to configure the electronic device 1000 incorporated with the electronic equipment 100, and it is possible to provide an advantageous effect similar to the advantageous effect of the above-described electronic equipment 100.

Further, the electronic device 1000 in the first example embodiment of the present invention includes the electronic equipment 100 and the accommodation rack 200. The electronic equipment 100 is mounted on the accommodation rack 200. Further, the accommodation rack 200 further includes the accommodation-rack-side connector portion 223 to be connected to the connector portion 13. Thus, it is possible to electrically connect between the electronic equipment 100 and the accommodation rack 200 via the connector portion 13 and the accommodation-rack-side connector portion 223. Further, it is possible to configure the electronic device 1000 incorporated with the electronic equipment 100, and it is possible to provide an advantageous effect similar to the advantageous effect of the above-described electronic equipment 100.

First Modification Example of First Example Embodiment

A configuration of electronic equipment 100A being a first modification example of the electronic equipment in the first example embodiment of the present invention is described, based on the drawings.

Figure 10:
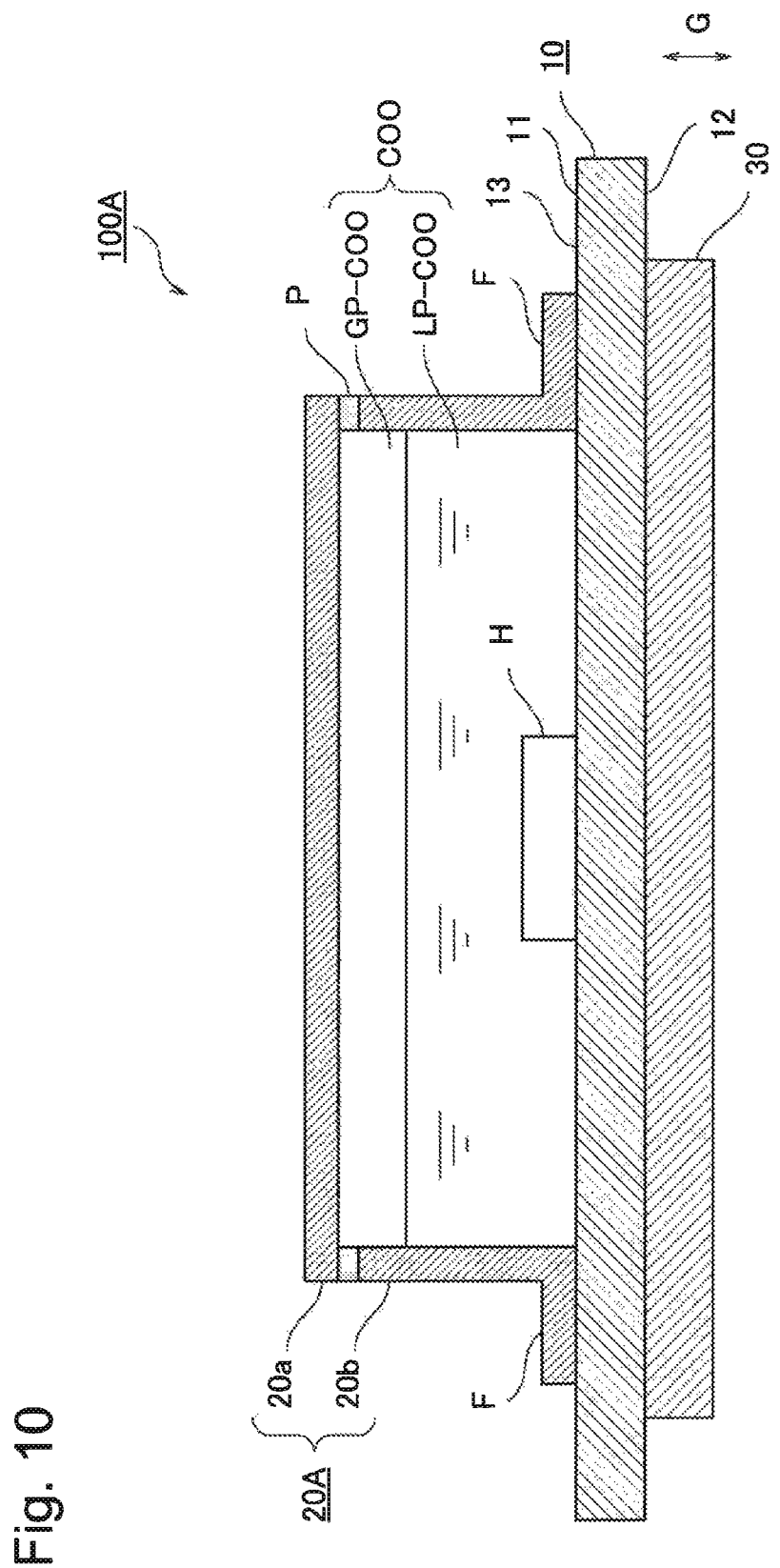
FIG. 10 is a cross-sectional view illustrating a configuration of a first modification example of the electronic equipment in the first example embodiment of the present invention.
Figure 11:
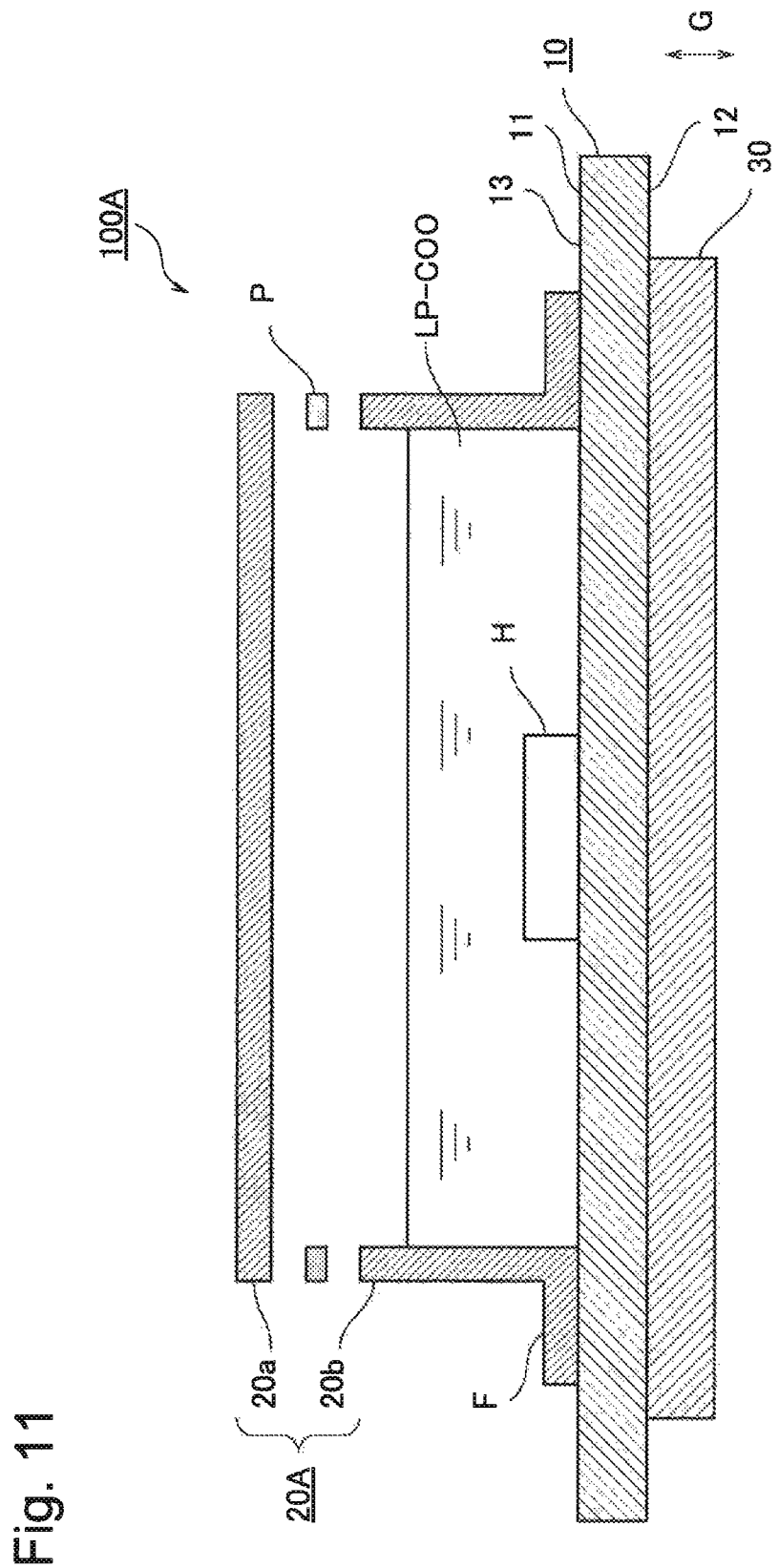
FIG. 11 is a cross-sectional view illustrating a configuration of the first modification example of the electronic equipment in the first example embodiment of the present invention, and is a diagram in which a lid portion is dismounted.

FIG. 10 is a cross-sectional view illustrating a configuration of the electronic equipment 100A. FIG. 11 is a cross-sectional view illustrating a configuration of the electronic equipment 100A, and is a diagram in which a lid portion 20a is dismounted. Note that, in FIGS. 10 and 11, a vertical direction G is illustrated. Further, in FIGS. 10 and 11, constituent elements equivalent to respective constituent elements illustrated in FIGS. 1 to 9 are indicated with same reference numbers as the reference numbers illustrated in FIGS. 1 to 9.

Referring to FIGS. 10 and 11, the electronic equipment 100A includes a circuit board 10, a first housing 20A, a deformation suppressing portion 30, and an elastic member P. The electronic equipment 100A is able to be mounted to an accommodation rack 200 similarly to the electronic equipment 100. Note that the electronic equipment 100A may be used as an electronic module to be incorporated in a communication device, a server, and the like, for example.

Herein, comparison is made between the electronic equipment 100 and the electronic equipment 100A. As illustrated in FIG. 1, in the electronic equipment 100, the first housing 20 is integrally formed. On the other hand, in the electronic equipment 100A, the first housing 20A includes the lid portion 20a and a frame portion 20b. In this point, the former and the latter are different from each other.

As illustrated in FIGS. 10 and 11, the first housing 20A includes the lid portion 20a and the frame portion 20b.

The lid portion 20a is formed into a plate shape, for example. The lid portion 20a is formed in such a way as to face a first main surface 11 of the circuit board 10. The lid portion 20a is connected to the frame portion 20b via the elastic member P. Note that, as a material of the lid portion 20a, a thermal conductive material such as aluminum or aluminum alloy is used.

The frame portion 20b surrounds an outer peripheral portion of the lid portion 20a. More specifically, the frame portion 20b is configured to include a plane connecting between the outer peripheral portion of the lid portion 20a, and the first main surface 11. The frame portion 20b is connected to the lid portion 20a via the elastic member P. Further, the frame portion 20b includes a flange portion F. Note that, as a material of the frame portion 20b, a thermal conductive material such as aluminum or aluminum alloy is used.

The elastic member P is provided between the lid portion 20a and the frame portion 20b. Further, the elastic member P is compressed and fixed between the lid portion 20a and the frame portion 20b. A shape of the elastic member P is formed into an annular shape in accordance with a shape of the frame portion 20b. As a material of the elastic member P, natural rubber or synthetic rubber is used, for example.

A configuration of the electronic equipment 100A is described as above.

Next, a manufacturing method of the electronic equipment 100A is described. First, the circuit board 10 on which a heating element H is mounted is prepared. Next, the frame portion 20b is mounted on the first main surface 11 of the circuit board 10 by an adhesive agent, a screw, or the like. Further, the elastic member P is interposed between the lid portion 20a and the frame portion 20b, and the lid portion 20a is connected to the frame portion 20b by a screw or the like. Thus, a sealed space is formed between the first housing 20A and the circuit board 10. Further, the deformation suppressing portion 30 is mounted on a second main surface 12. Then, a coolant COO is filled in a space between the first housing 20A and the circuit board 10. A method for filling the space between the first housing 20A and the circuit board 10 with the coolant COO is similar to the manufacturing method of the electronic equipment 100.

Further, the electronic equipment 100A may also be manufactured as follows. First, the circuit board 10 on which the heating element H is mounted is prepared. Next, the frame portion 20b is mounted on the first main surface 11 of the circuit board 10 by an adhesive agent, a screw, or the like. Then, the coolant COO is injected into the frame portion 20b. Further, the elastic member P is interposed between the lid portion 20a and the frame portion 20b, and the lid portion 20a is connected to the frame portion 20b by a screw or the like. Thus, a sealed space is formed between the first housing 20A and the circuit board 10. Further, the deformation suppressing portion 30 is mounted on the second main surface 12. Air is ejected from the space between the first housing 20A and the circuit board 10 by using a vacuum pump (not illustrated) or the like through an air ejection hole (not illustrated), which is formed in advance in the lid portion 20a. Next, the air ejection hole is closed. In this way, the coolant COO is sealed in the space between the first housing 20A and the circuit board 10. Thus, the pressure of the space between the first housing 20A and the circuit board 10 becomes equal to a saturated steam pressure of the coolant COO, and a boiling point of the coolant COO sealed in the space between the first housing 20A and the circuit board 10 approaches a room temperature.

A manufacturing method of the electronic equipment 100A is described as above.

In the electronic equipment 100A being the first modification example of the electronic equipment 100 in the first example embodiment, the first housing 20A is configured to include the lid portion 20a and the frame portion 20b. The lid portion 20a faces the first main surface 11 of the circuit board 10. The frame portion 20b is configured to surround an outer peripheral portion of the lid portion 20a.

In this way, it is possible to configure in such a way that the first housing 20A is divided into the lid portion 20a and the frame portion 20b. Thus, unlike the electronic equipment 100, it is possible to inspect or exchange an electronic component (including the heating element H) mounted on the first main surface 11 of the circuit board 10 merely by dismounting the lid portion 20a, without dismounting the entirety of the first housing 20 from the circuit board 10. In this way, the electronic equipment 100A makes it easy to perform a maintenance operation, as compared to the electronic equipment 100.

Further, the electronic equipment 100A being the first modification example of the electronic equipment 100 in the first example embodiment further includes the elastic member P provided between the lid portion 20a and the frame portion 20b. Further, the lid portion 20a and the frame portion 20b are connected in such a way as to compress the elastic member P. Specifically, by compressing the elastic member P between the lid portion 20a and the frame portion 20b, the heating element H and the coolant COO are sealed between the first main surface 11 of the circuit board 10 and the first housing 20A. Thus, it is possible to suppress formation of a gap between the lid portion 20a and the frame portion 20b. Consequently, it is possible to suppress leakage of the coolant COO from between the lid portion 20a and the frame portion 20b.

Second Modification Example of First Example Embodiment

A configuration of electronic equipment 100B being a second modification example of the electronic equipment in the first example embodiment of the present invention is described, based on the drawings.

Figure 12:
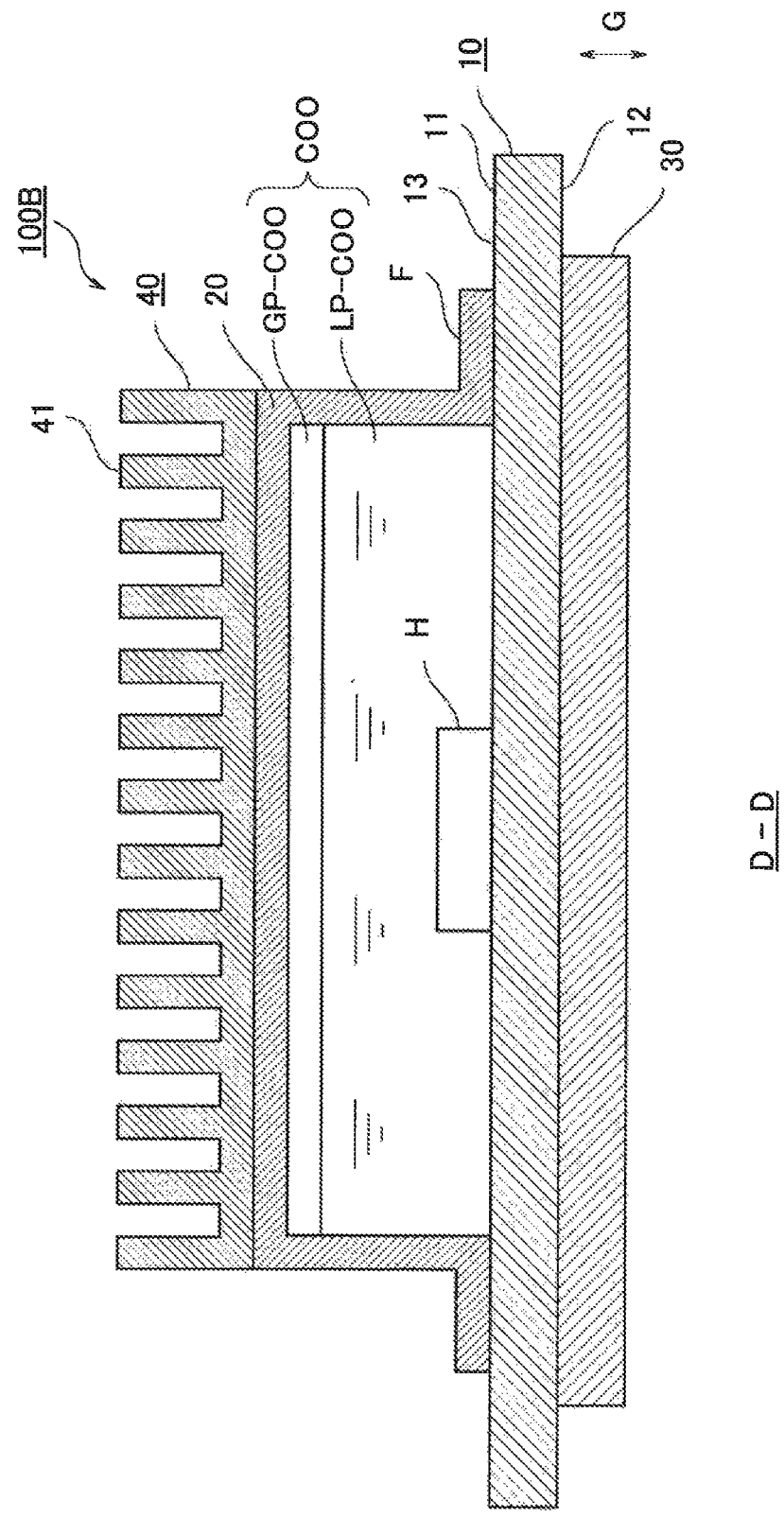
FIG. 12 is a cross-sectional view illustrating a configuration of a second modification example of the electronic equipment in the first example embodiment of the present invention, and is a diagram illustrating a cross section taken along the plane D-D in FIG. 15.
Figure 13:
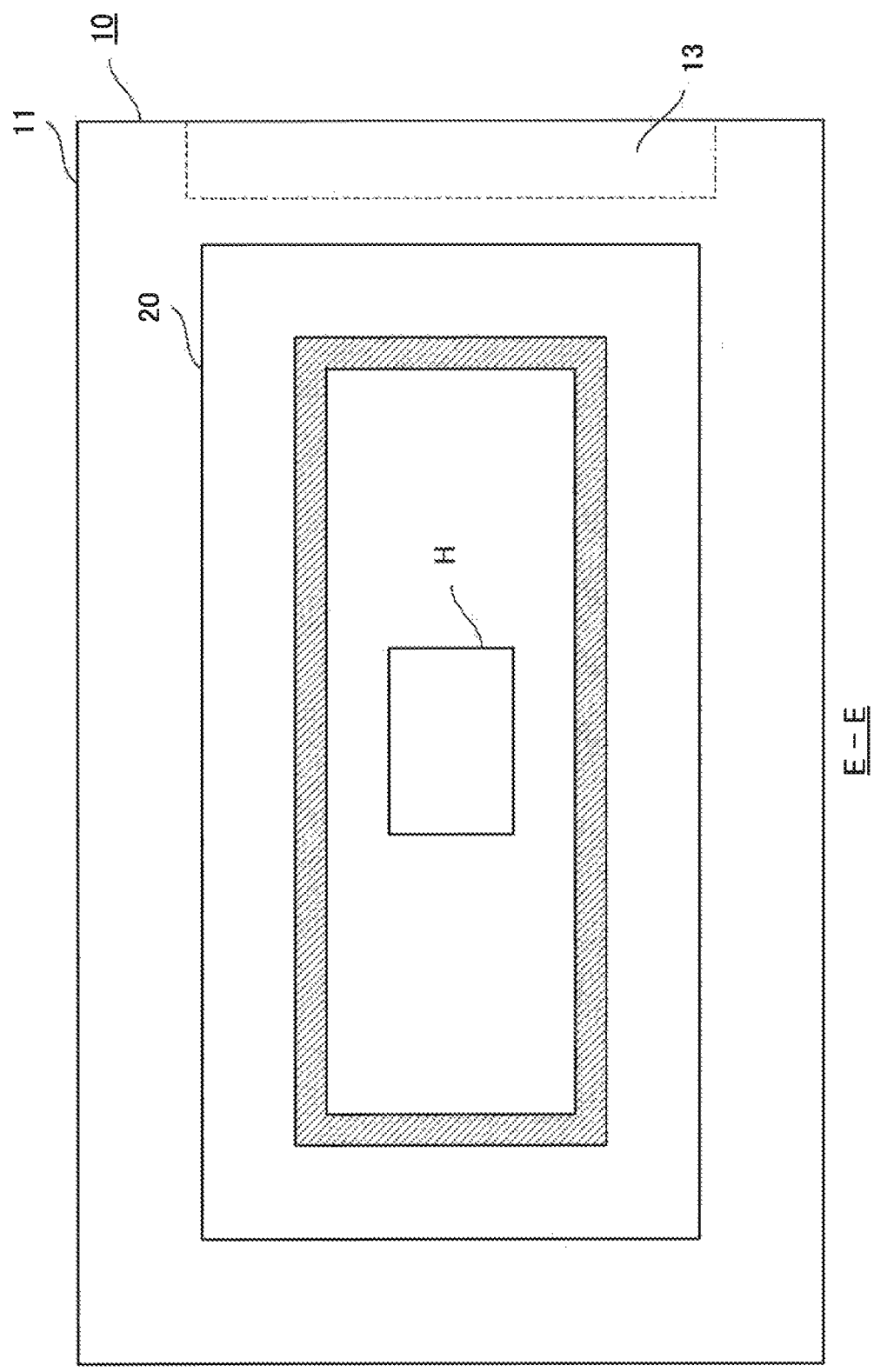
FIG. 13 is a cross-sectional view illustrating a configuration of the second modification example of the electronic equipment in the first example embodiment of the present invention, and is a diagram illustrating a cross section taken along the plane E-E in FIG. 14.
Figure 14:
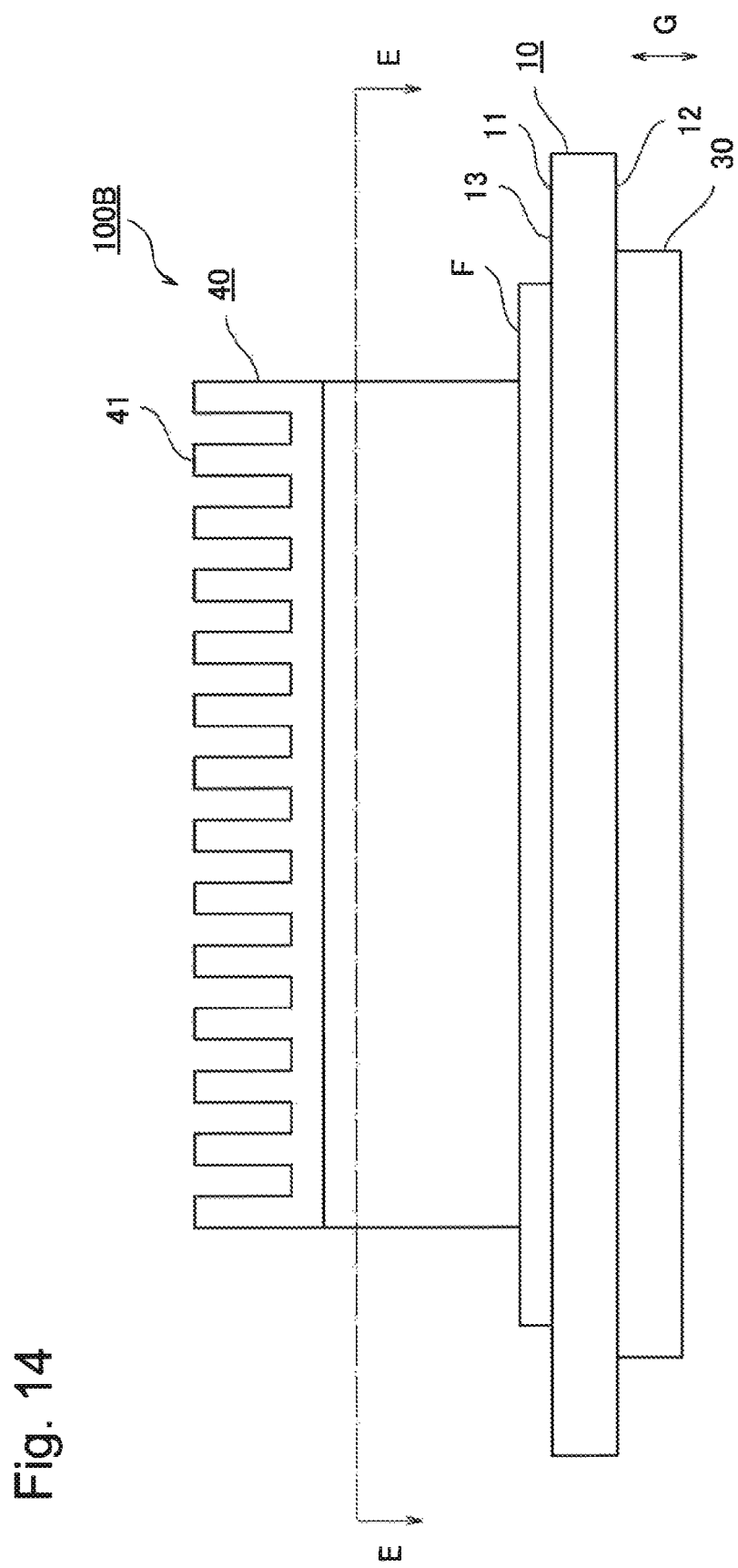
FIG. 14 is a side view illustrating a configuration of the second modification example of the electronic equipment in the first example embodiment of the present invention.
Figure 15:
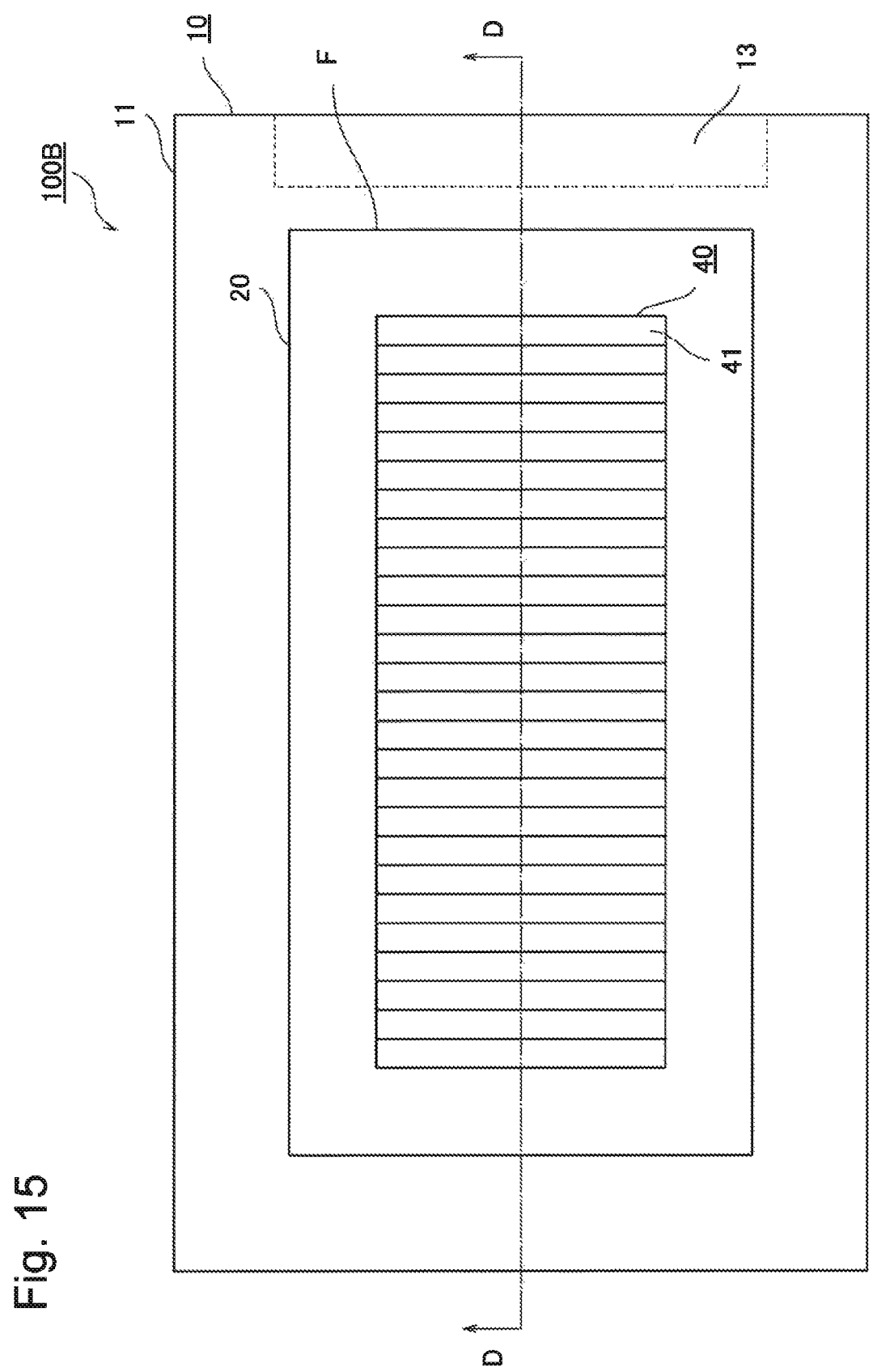
FIG. 15 is a top plan view illustrating a configuration of the second modification example of the electronic equipment in the first example embodiment of the present invention.

FIG. 12 is a cross-sectional view illustrating a configuration of the electronic equipment 100B, and is a diagram illustrating a cross section taken along the plane D-D in FIG. 15. FIG. 13 is a cross-sectional view illustrating a configuration of the electronic equipment 100B, and is a diagram illustrating a cross section taken along the plane E-E in FIG. 14. FIG. 14 is a side view illustrating a configuration of the electronic equipment 100B. FIG. 15 is a top plan view illustrating a configuration of the electronic equipment 100B.

Note that, in FIGS. 12 and 14, a vertical direction G is illustrated. Further, in FIGS. 12 to 15, constituent elements equivalent to respective constituent elements illustrated in FIGS. 1 to 11 are indicated with same reference numbers as the reference numbers illustrated in FIGS. 1 to 11.

Referring to FIGS. 13 and 14, the electronic equipment 100B includes a circuit board 10, a first housing 20, a deformation suppressing portion 30, and a heat radiating portion 40. The electronic equipment 100B is able to be mounted to an accommodation rack 200 similarly to the electronic equipment 100. Note that the electronic equipment 100B may be used as an electronic module to be incorporated in a communication device, a server, or the like, for example.

Herein, comparison is made between the electronic equipment 100 and the electronic equipment 100B. As illustrated in FIG. 14, the electronic equipment 100B is different from the electronic equipment 100 in a point that the heat radiating portion 40 is further included.

Referring to FIGS. 12 to 15, the heat radiating portion 40 is mounted on an upper surface of the first housing 20 (a surface on the upper side on the planes of FIGS. 12 and 14). At this occasion, the heat radiating portion 40 is mounted on the first housing 20 by adhesion with use of an adhesive agent or a screw, for example. Note that the heating radiating portion 40 may be integrally formed with the first housing 20.

The heat radiating portion 40 includes a plurality of heat radiating fins 41. The heat radiating fin 41 is formed into a flat plate shape. As illustrated in FIGS. 12 and 14, the heat radiating fin 41 is formed in such a way as to extend along the vertical direction G. Note that, as a material of the heat radiating portion 40, a thermal conductive material such as aluminum or aluminum alloy is used.

As described above, the electronic equipment 100B being the second modification example of the first example embodiment further includes the heat radiating portion 40. The heat radiating portion 40 is mounted on the first housing 20. Further, the heat radiating portion 40 radiates heat of a heating element H which receives heat via a coolant COO to the outside of the first housing 20.

Thus, the heat radiating portion 40 is also able to radiate heat of the heating element H to the outside, in addition to the first housing 20. Consequently, it is possible to further efficiently radiate heat of the heating element H, as compared to the electronic equipment 100.

Third Modification Example of First Example Embodiment

A configuration of electronic equipment 100C being a third modification example of the electronic equipment in the first example embodiment of the present invention is described, based on the drawing.

Figure 16:
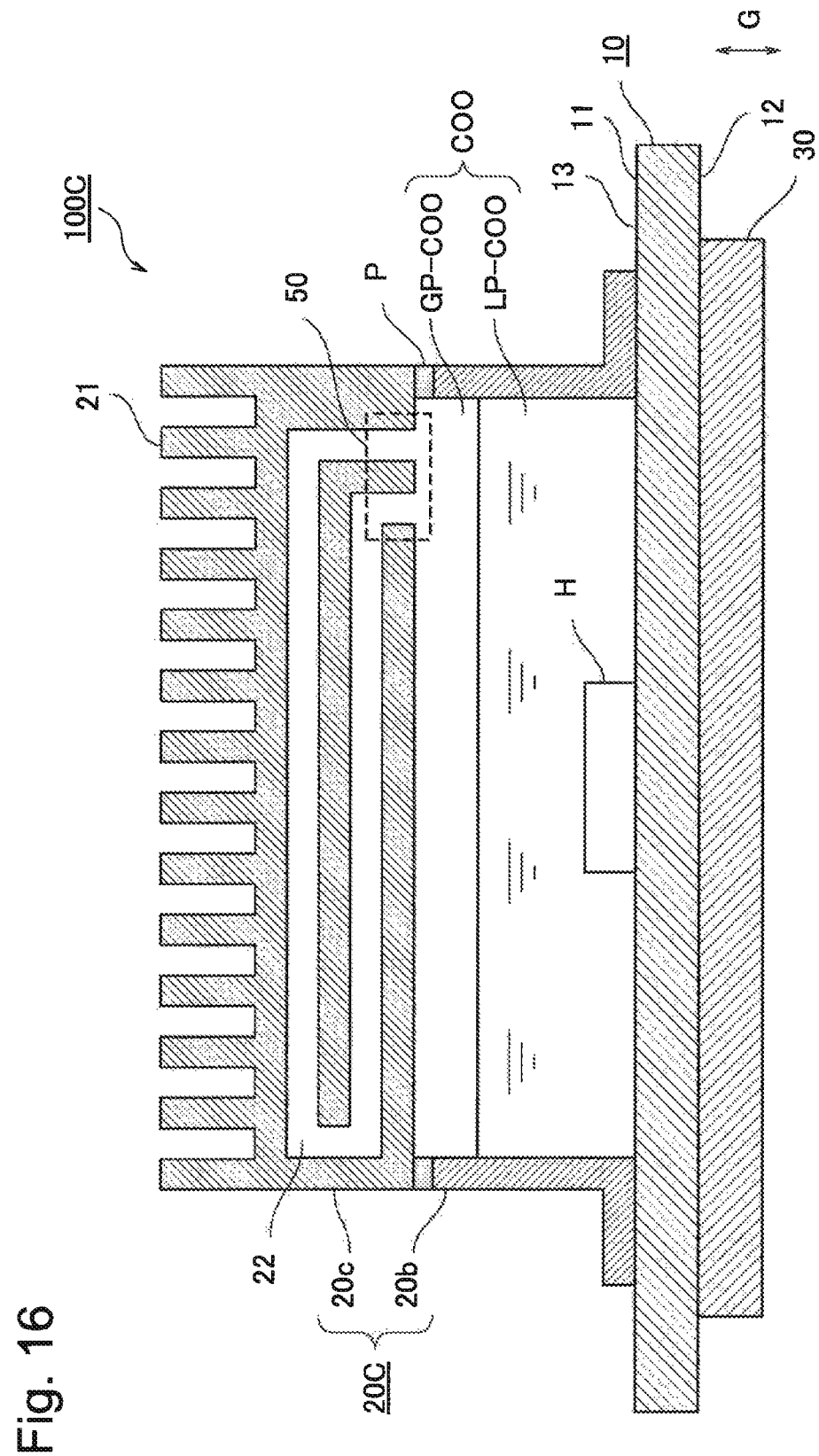
FIG. 16 is a cross-sectional view illustrating a configuration of a third modification example of the electronic equipment in the first example embodiment of the present invention.

FIG. 16 is a cross-sectional view illustrating a configuration of the electronic equipment 100C. Note that, in FIG. 16, a vertical direction G is illustrated. Further, in FIG. 16, constituent elements equivalent to respective constituent elements illustrated in FIGS. 1 to 15 are indicated with same reference numbers as the reference numbers illustrated in FIGS. 1 to 15.

Referring to FIG. 16, the electronic equipment 100C includes a circuit board 10, a first housing 20C, a deformation suppressing portion 30, an elastic member P, and a pump 50. The electronic equipment 100C may be mounted to an accommodation rack 200 similarly to the electronic equipment 100. Note that the electronic equipment 100C may be used as an electronic module to be incorporated in a communication device, a server, or the like, for example.

Herein, comparison is made between the electronic equipment 100A and the electronic equipment 100C. As illustrated in FIG. 10, in the electronic equipment 100A, the first housing 20A is constituted of the lid portion 20a and the frame portion 20b. On the other hand, as illustrated in FIG. 16, in the electronic equipment 100C, the first housing 20C is constituted of a frame portion 20b and a heat-radiating-function equipped lid portion 20c. Specifically, in the electronic equipment 100C, the heat-radiating-function equipped lid portion 20c is provided, in place of the lid portion 20a of the electronic equipment 100A. In this point, the former and the latter are different. Further, the electronic equipment 100C is different from the electronic equipment 100A in a point that the pump 50 is provided.

As illustrated in FIG. 16, the first housing 20C includes the frame portion 20b and the heat-radiating-function equipped lid portion 20c. A configuration of the frame portion 20b is as described above. The heat-radiating-function equipped lid portion 20c is an element in which a heat radiating function is added to the lid portion 20a. The heat-radiating-function equipped lid portion 20c is disposed to face a first main surface 11 of the circuit board 10. The heat-radiating-function equipped lid portion 20c is connected to the frame portion 20b via the elastic member P.

A plurality of heat radiating fins 21 are mounted on an upper surface of the heat-radiating-function equipped lid portion 20c (a surface on the upper side on the plane of FIG. 16). The heat radiating fin 21 is formed into a flat plate shape. As illustrated in FIG. 16, the heat radiating fin 21 is formed in such a way as to extend along the vertical direction G.

Further, as illustrated in FIG. 16, a circulation path 22 for a coolant COO is formed inside the heat-radiating-function equipped lid portion 20c. Note that, as a material of the heat-radiating-function equipped lid portion 20c, a thermal conductive material such as aluminum or aluminum alloy is used.

The pump 50 is mounted near an inlet/output port of the coolant COO in the circulation path 22. The pump 50 accelerates circulation of the coolant COO within the circulation path 22.

A configuration of the electronic equipment 100C is described as above.

Next, a manufacturing method of the electronic equipment 100C is described. First, the circuit board 10 on which a heating element H is mounted is prepared. Next, the frame portion 20b is mounted on the first main surface 11 of the circuit board 10 by an adhesive agent, a screw, or the like. Further, the elastic member P is interposed between the heat-radiating-function equipped lid portion 20c and the frame portion 20b, and the heat-radiating-function equipped lid portion 20c is connected to the frame portion 20b by a screw or the like. Thus, a sealed space is formed between the first housing 20C and the circuit board 10. Further, the deformation suppressing portion 30 is mounted on a second main surface 12. Then, the coolant COO is filled in a space between the first housing 20C and the circuit board 10.

A method for filling the space between the first housing 20C and the circuit board 10 with the coolant COO is similar to the manufacturing methods of the electronic equipment 100 and the electronic equipment 100B.

A manufacturing method of the electronic equipment 100C is described as above.

Next, an operation of the electronic equipment 100C is described. When the heating element H on the circuit board 10 is heated, a liquid-phase coolant LP-COO is boiled by the heat of the heating element H on the surface of the heating element H, and turns to a gas-phase coolant GP-COO by phase change. Thus, air bubbles of the gas-phase coolant GP-COO are generated. The heat generated on the heating element H is dissipated by the heat of vaporization (latent heat) generated by the phase change. Consequently, the heating element H is cooled.

The gas-phase coolant GP-COO rises upward in the vertical direction G within the liquid-phase coolant LP-COO, escapes from a liquid surface of the liquid-phase coolant LP-COO, and further rises upward in the vertical direction G. Further, when the gas-phase coolant GP-COO boiled by the heat of the heating element H is cooled by contact with an inner wall surface of the first housing 20C, the gas-phase coolant GP-COO turns to the liquid-phase coolant LP-COO again by phase change. The liquid-phase coolant LP-COO falls downward in the vertical direction G within the first housing 20C, stays on the circuit board 10 side, and is used again for cooling the heating element H.

Herein, the gas-phase coolant GP-COO is circulated in the circulation path 22 by power of the pump 50. This enables to make a surface area where the gas-phase coolant GP-COO comes into contact with the first housing 20C large, as compared to the electronic equipment 100. Consequently, it is possible to more efficiently radiate heat of the heating element H.

Further, the heat of the heating element H received by the first housing 20C is radiated to the outside via the heat radiating fins 21.

As described above, in the electronic equipment 100C being the third modification example of the first example embodiment, the circulation path 22 is formed inside a heat radiating portion (heat-radiating-function equipped lid portion 20c) in such a way that the coolant COO is allowed to circulate. In this way, forming the circulation path 22 and circulating the coolant COO enables to make a surface area where the coolant COO comes into contact with the first housing 20C large, as compared to the electronic equipment 100. Consequently, it is possible to more efficiently radiate heat of the heating element H. Further, causing the pump 50 to circulate the coolant COO in the circulation path 22 enables to accelerate circulation of the coolant COO. Therefore, it is possible to more efficiently cool the heating element H.

Second Example Embodiment

A configuration of electronic equipment 100D in a second example embodiment of the present invention is described, based on the drawings.

Figure 17:
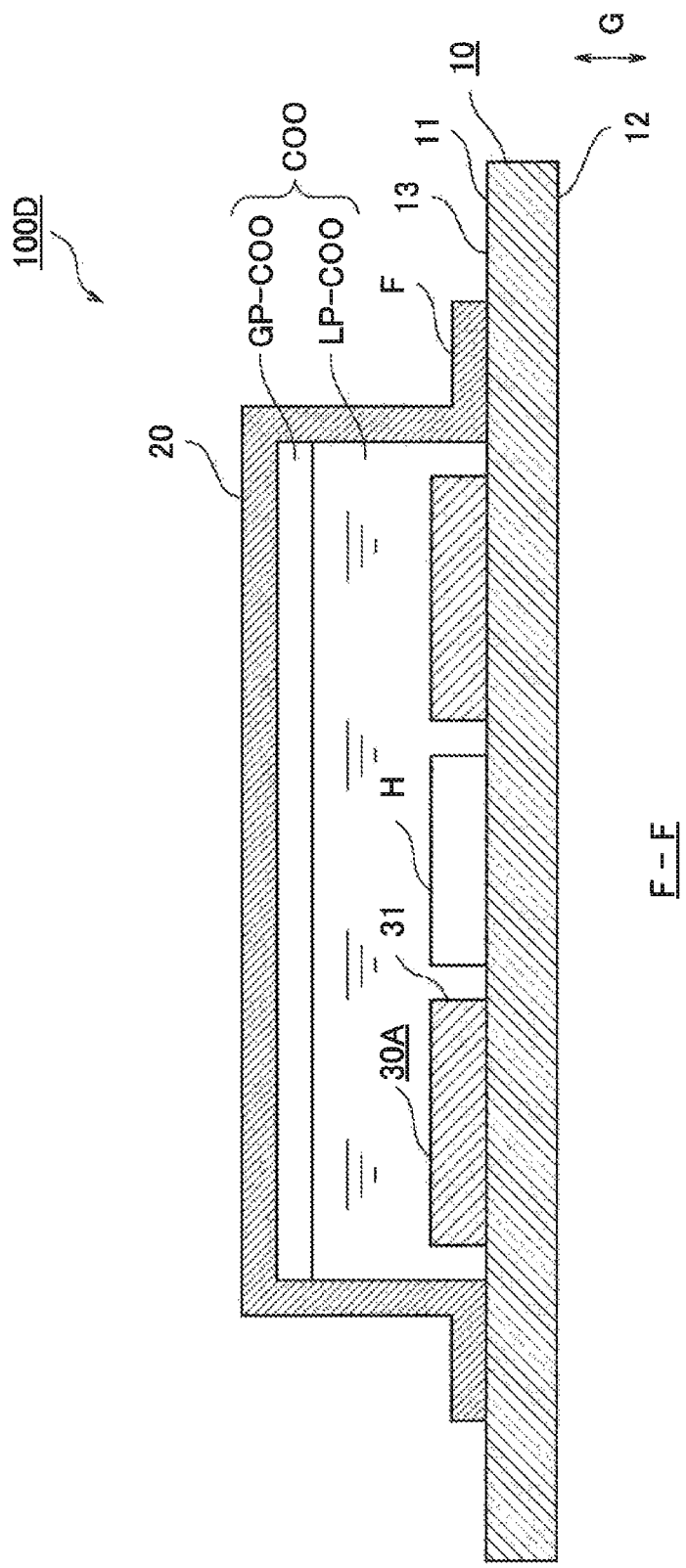
FIG. 17 is a cross-sectional view illustrating a configuration of electronic equipment in a second example embodiment of the present invention, and is a diagram illustrating a cross section taken along the plane F-F in FIG. 20.
Figure 18:
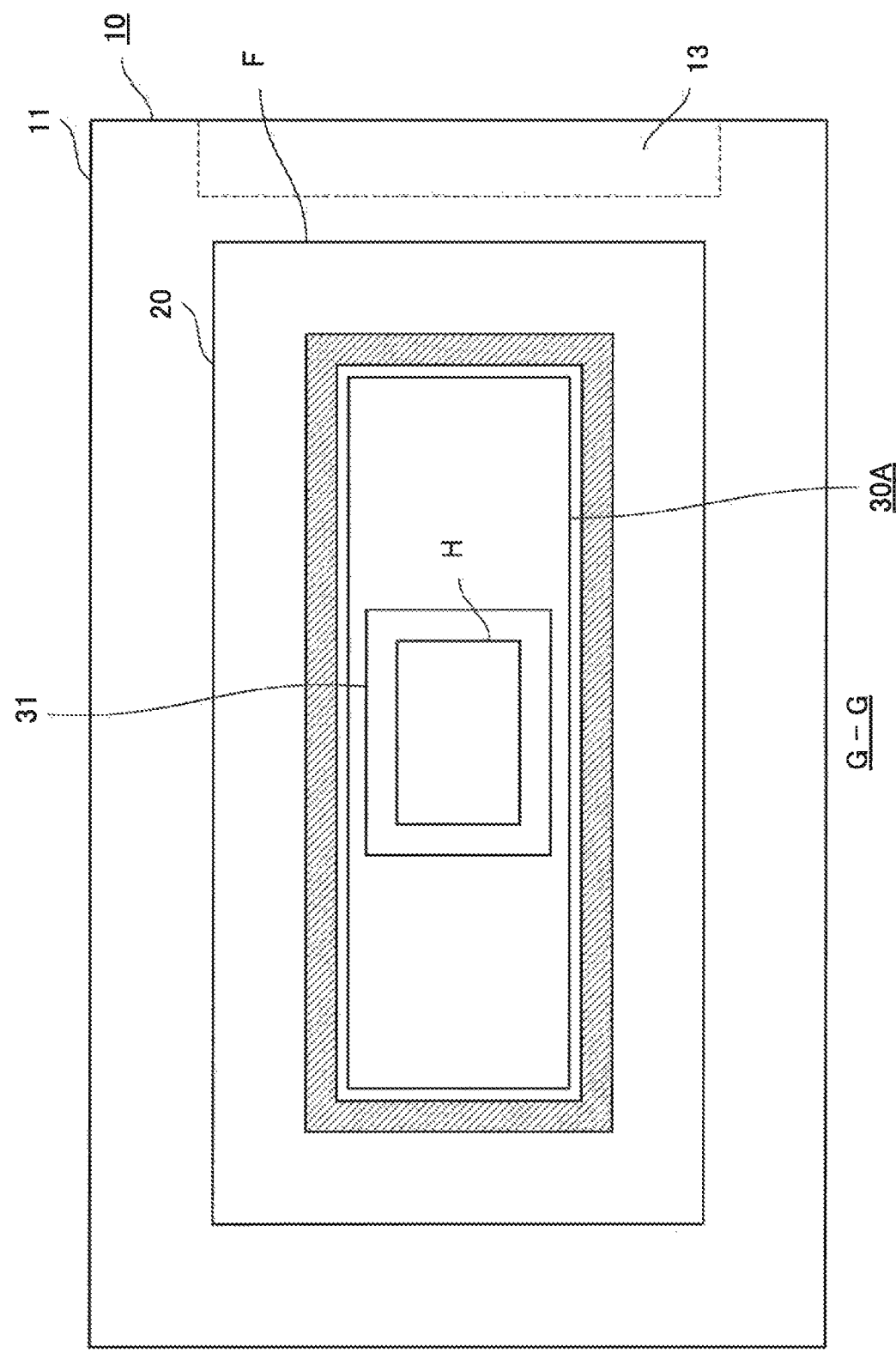
FIG. 18 is a cross-sectional view illustrating a configuration of the electronic equipment in the second example embodiment of the present invention, and is a diagram illustrating a cross section taken along the plane G-G in FIG. 19.
Figure 19:
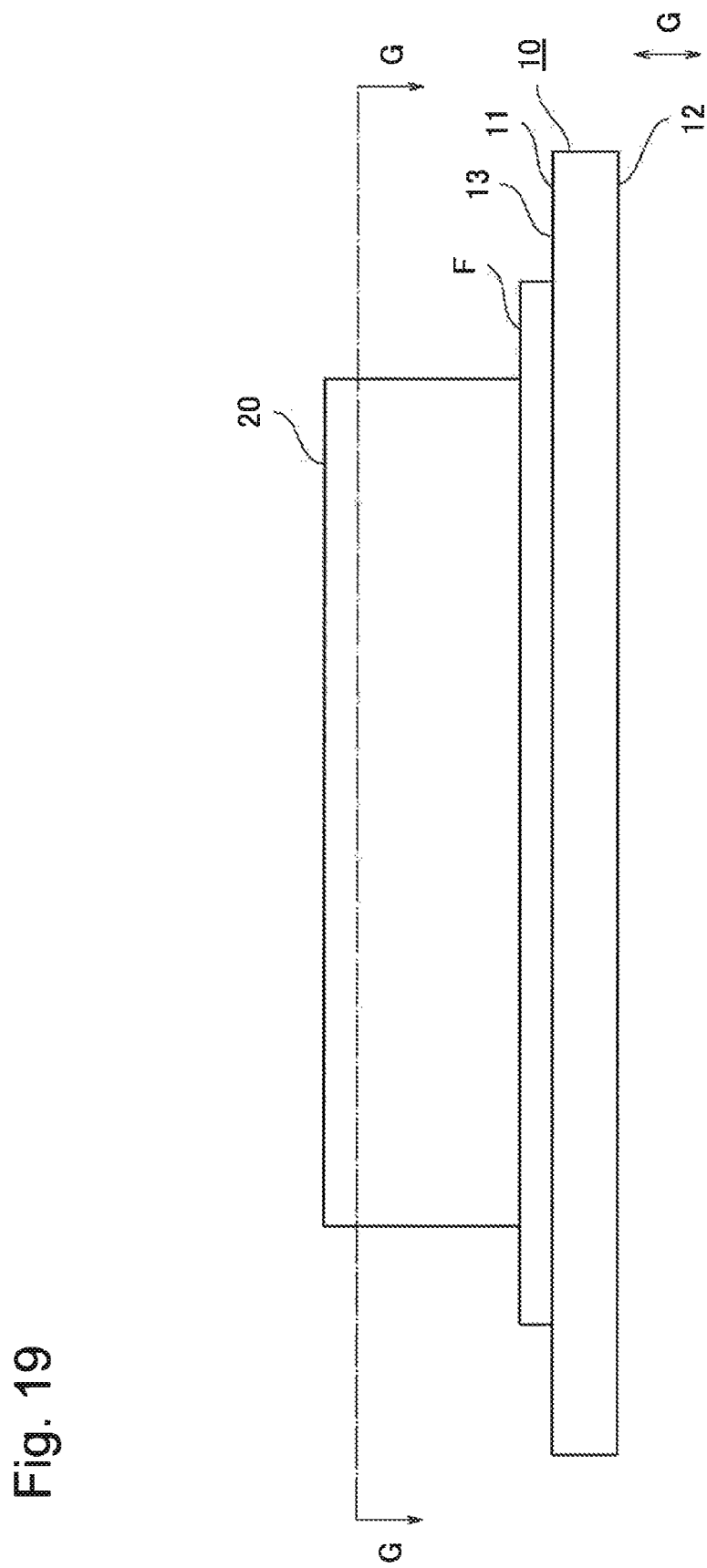
FIG. 19 is a side view illustrating a configuration of the electronic equipment in the second example embodiment of the present invention.
Figure 20:
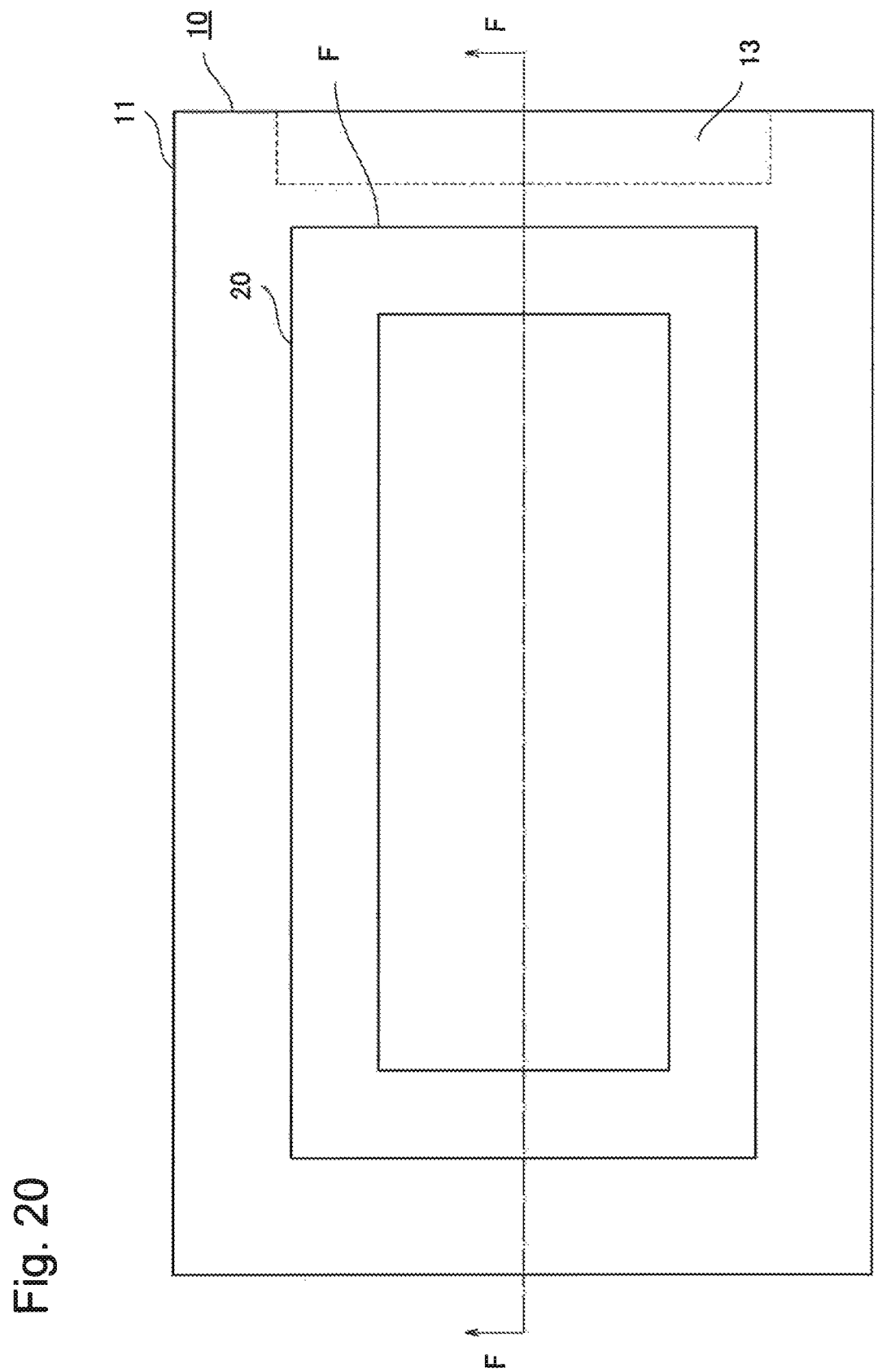
FIG. 20 is a top plan view illustrating a configuration of the electronic equipment in the second example embodiment of the present invention.

FIG. 17 is a cross-sectional view illustrating a configuration of the electronic equipment 100D, and is a diagram illustrating a cross section taken along the plane F-F in FIG. 20. FIG. 18 is a cross-sectional view illustrating a configuration of the electronic equipment 100D, and is a diagram illustrating a cross section taken along the plane G-G in FIG. 19. FIG. 19 is a side view illustrating a configuration of the electronic equipment 100D. FIG. 20 is a top plan view illustrating a configuration of the electronic equipment 100D.

Note that, in FIGS. 17 and 19, a vertical direction G is illustrated. Further, in FIGS. 17 to 20, constituent elements equivalent to respective constituent elements illustrated in FIGS. 1 to 16 are indicated with same reference numbers as the reference numbers illustrated in FIGS. 1 to 16.

Referring to FIGS. 17 to 20, the electronic equipment 100D includes a circuit board 10, a first housing 20, and a deformation suppressing portion 30A. The electronic equipment 100D is able to be mounted to an accommodation rack 200 similarly to the electronic equipment 100. Note that the electronic equipment 100D may be used as an electronic module to be incorporated in a communication device, a server, or the like, for example.

Herein, comparison is made between the electronic equipment 100D and the electronic equipment 100. As illustrated in FIG. 1, in the electronic equipment 100, the deformation suppressing portion 30 is mounted on the second main surface 12 of the circuit board 10. On the other hand, as illustrated in FIGS. 17 and 18, in the electronic equipment 100D, the deformation suppressing portion 30A is mounted on a first main surface 11 of the circuit board 10. In this point, the former and the latter are different from each other.

Referring to FIGS. 17 to 20, the deformation suppressing portion 30A is a plate member. The deformation suppressing portion 30A is mounted on the first main surface 11 of the circuit board 10. Thus, it is possible to form plywood by the circuit board 10 and the deformation suppressing portion 30A. Generally, an allowable stress of the plywood is made large, as compared to a configuration made only of the circuit board 10. Consequently, it is possible to suppress deformation of the circuit board 10 due to the weight or a pressure of a coolant COO.

Further, the deformation suppressing portion 30A includes an opening portion 31. A size of the opening portion 31 is set in accordance with an outer shape of a heating element H. The heating element H is disposed inside the opening portion 31. In this way, the deformation suppressing portion 30A is formed in such a way that at least a mounting area of the heating element H is not covered in the first main surface 11. Thus, it is possible to mount the deformation suppressing portion 30A on the first main surface 11 in such a way that the deformation suppressing portion 30A and the heating element H do not interfere. In addition to the above, it is possible to transfer heat of the heating element H to the coolant COO, without being blocked by the deformation suppressing portion 30A. Note that, when an electronic component other than the heating element H is mounted on the first main surface 11, the deformation suppressing portion 30A may be provided in such way as not to interfere with these electronic components. The deformation suppressing portion 30A is mounted on the circuit board 10 by an adhesive agent, a screw, or the like, for example.

As a material of the deformation suppressing portion 30A, iron, stainless alloy, or the like is used, for example. Further, the deformation suppressing portion 30A is formed in such a way that at least rigidity capable of withstanding a pressure generated when the coolant COO turns from a liquid-phase coolant LP-COO to a gas-phase coolant GP-COO by phase change is secured, as the weights of the coolant COO, the heating element H, the first housing 20, and the like are added.

A configuration of the electronic equipment 100D is described as above.

As described above, in the electronic equipment 100D in the second example embodiment of the present invention, the deformation suppressing portion 30A is a plate member mounted on the first main surface 11 of the circuit board 10. Also in this configuration, it is possible to suppress deformation of the circuit board 10 due to the weight or a pressure of the coolant COO, the heating element H, or the like, similarly to the electronic equipment 100 in which the deformation suppressing portion 30 being a plate member is mounted on the second main surface 12 of the circuit board 10. Further, since it is possible to suppress deformation of the circuit board 10, it is possible to suppress formation of a gap between the circuit board 10 and the first housing 20 at a joint portion between the circuit board 10 and the first housing 20.

Therefore, according to the electronic equipment 100D in the second example embodiment of the present invention, even when the heating element H and the coolant COO are sealed in a space surrounded by the circuit board 10 and the first housing 20, it is possible to suppress a failure such as leakage of the coolant COO or cutting of a wiring formed on the circuit board.

Further, in the electronic equipment 100D in the second example embodiment of the present invention, the deformation suppressing portion 30A being a plate member mounted on the first main surface 11 is provided in such a way as not to cover a mounting area of the heating element H in the first main surface 11. Thus, it is possible to mount the deformation suppressing portion 30A on the first main surface 11 in such a way that the deformation suppressing portion 30A and the heating element H do not interfere.

Next, a configuration of electronic equipment 100DD being a modification of the electronic equipment in the second example embodiment of the present invention is described, based on the drawings.

Figure 21:
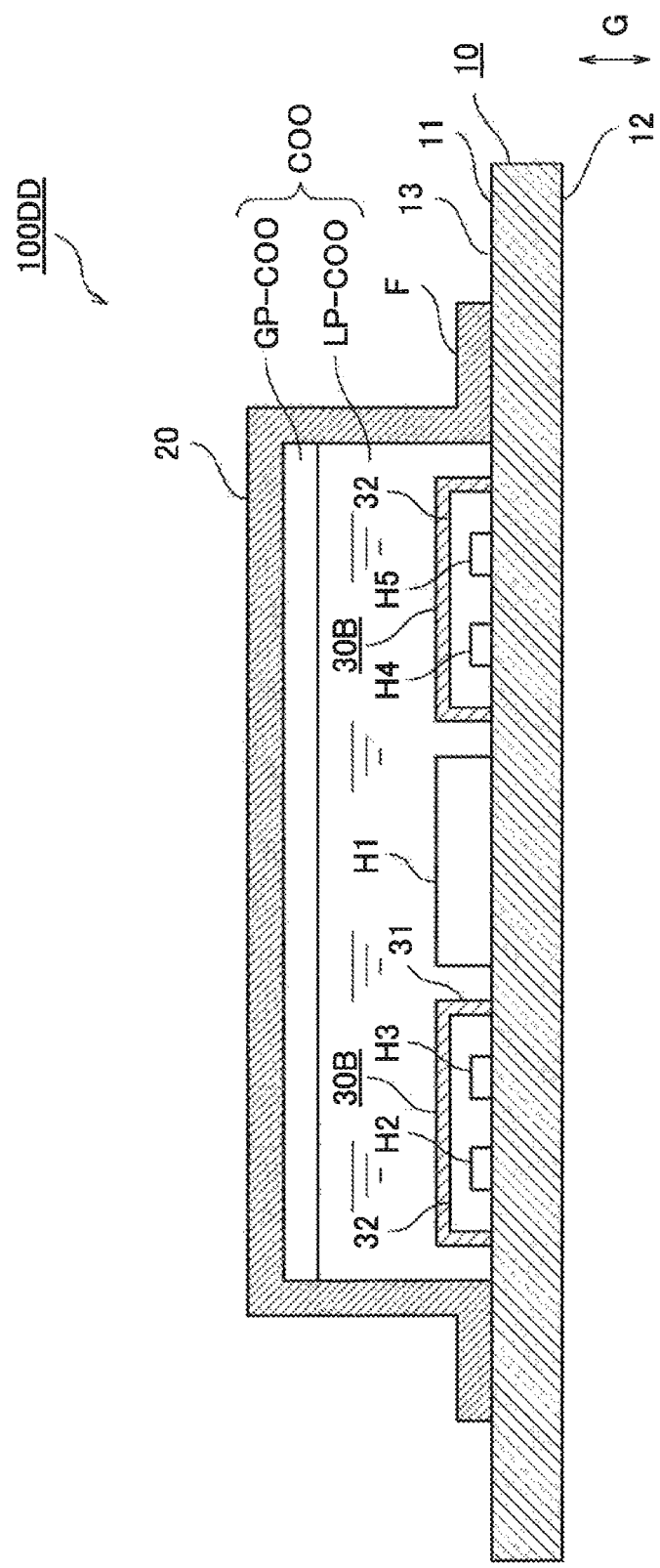
FIG. 21 is a cross-sectional view illustrating a configuration of a modification example of the electronic equipment in the second example embodiment of the present invention.
Figure 22:
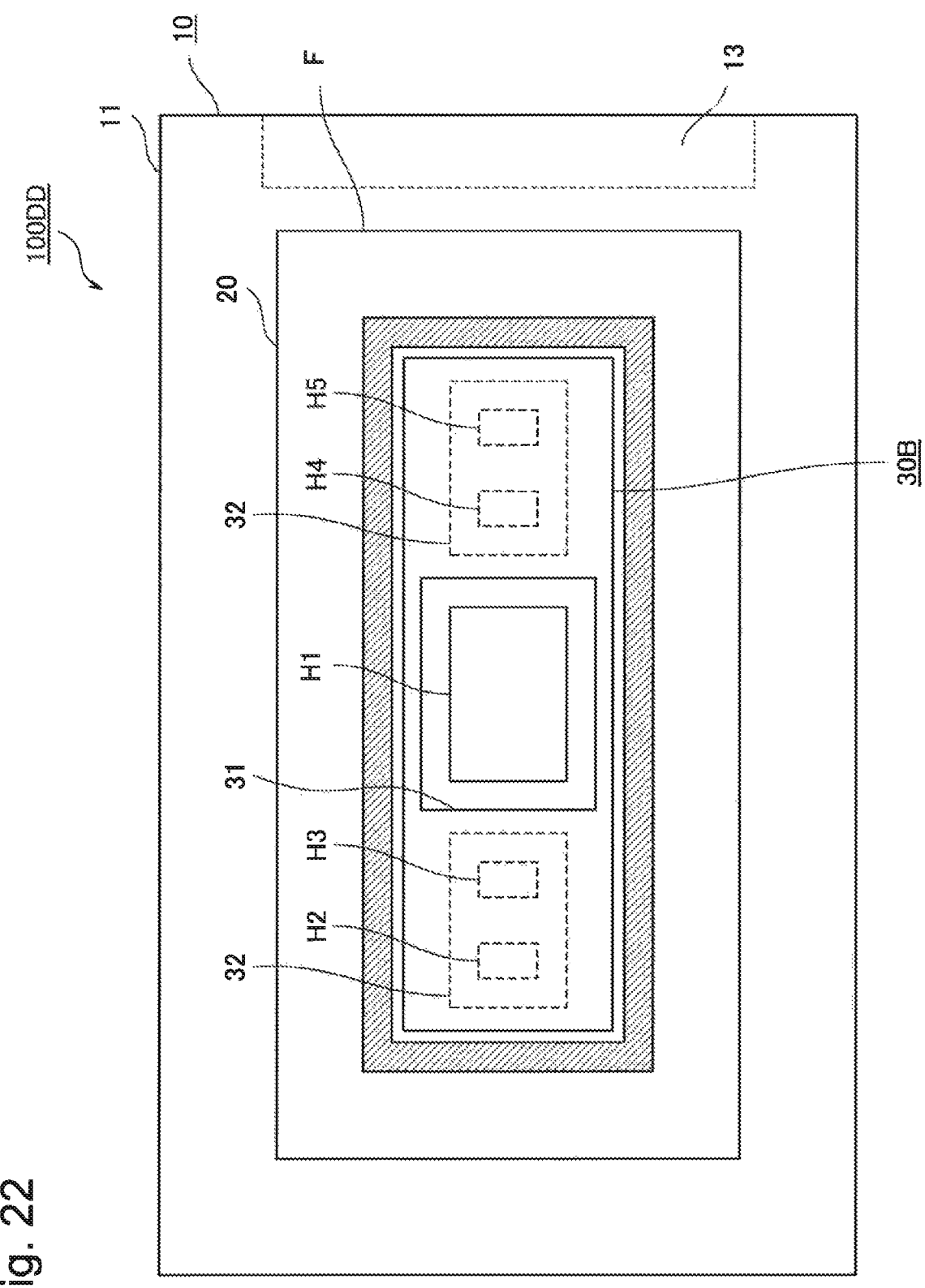
FIG. 22 is a cross-sectional view illustrating a configuration of the modification example of the electronic equipment in the second example embodiment of the present invention.

FIG. 21 is a cross-sectional view illustrating a configuration of the electronic equipment 100DD, and is a diagram illustrating a cross section when the electronic equipment 100DD is viewed from above. FIG. 22 is a cross-sectional view illustrating a configuration of the electronic equipment 100DD, and is a diagram when the electronic equipment 100DD is viewed from a side. Note that FIG. 21 is a diagram corresponding to FIG. 17, and FIG. 22 is a diagram corresponding to FIG. 18. Note that, in FIG. 21, a vertical direction G is illustrated. Further, in FIGS. 21 to 22, constituent elements equivalent to respective constituent elements illustrated in FIGS. 1 to 20 are indicated with same reference numbers as the reference numbers illustrated in FIGS. 1 to 20.

Referring to FIGS. 21 and 22, the electronic equipment 100DD includes a circuit board 10, a first housing 20, and a deformation suppressing portion 30B. The electronic equipment 100DD is able to be mounted to an accommodation rack 200 similarly to the electronic equipment 100. Note that the electronic equipment 100DD may be used as an electronic module to be incorporated in a communication device, a server, or the like, for example.

Herein, comparison is made between the electronic equipment 100DD and the electronic equipment 100D. As illustrated in FIGS. 17 and 18, in the electronic equipment 100D, one heating element H is mounted on the first main surface 11 of the circuit board 10. On the other hand, as illustrated in FIGS. 21 and 22, in the electronic equipment 100DD, a plurality of heating elements H1 to H5 are mounted on a first main surface 11 of the circuit board 10. Further, in the electronic equipment 100DD, the deformation suppressing portion 30B includes an opening portion 31 and a recess portion 32. On the other hand, in the electronic equipment 100D, the deformation suppressing portion 30A includes an opening portion 31 but does not include a recess portion 32. In these points, the electronic equipment 100D and the electronic equipment 100DD are different from each other.

Referring to FIGS. 21 and 22, the heating elements H1 to H5 are mounted on the first main surface 11 of the circuit board 10. Herein, it is assumed that an amount of heat generation of the heating element H1 is largest as compared to the heating elements H2 to H5. Specifically, an amount of heat generation of the heating element H1 is set to be highest among amounts of heat generation of all the heating elements H1 to H5.

Referring to FIGS. 21 and 22, the deformation suppressing portion 30B is a plate member. The deformation suppressing portion 30B is mounted on the first main surface 11 of the circuit board 10. Thus, it is possible to form plywood by the circuit board 10 and the deformation suppressing portion 30B. Generally, an allowable stress of the plywood is made large, as compared to a configuration made only of the circuit board 10. Consequently, it is possible to suppress deformation of the circuit board 10 due to the weight or a pressure of a coolant COO.

The deformation suppressing portion 30B includes the opening portion 31 and the recess portion 32. The size of the opening portion 31 is set in accordance with an outer shape of the heating element H1. The heating element H1 is disposed inside the opening portion 31. In this way, the deformation suppressing portion 30B is formed in such a way that a mounting area of the heating element H1 having a largest amount of heat generation among the plurality of heating elements H1 to H5 is not covered in the area of the first main surface 11. Thus, it is possible to mount the deformation suppressing portion 30B on the first main surface 11 in such a way that the deformation suppressing portion 30B and the heating element H1 do not interfere. In addition to the above, it is possible to efficiently transfer heat of the heating element H1 having a largest amount of heat generation to the coolant COO without being blocked by the deformation suppressing portion 30B.

Further, as illustrated in FIG. 21, the recess portion 32 is formed in a surface which faces the first main surface 11 of the circuit board 10. The heating elements H2 to H5 are accommodated in the recess portion 32. Specifically, the heating elements H2 to H5 except for the heating element H1 having a largest amount of heat generation among the plurality of heating elements H1 to H5 are accommodated in the recess portion 32. Thus, it is possible to mount the deformation suppressing portion 30B on the first main surface 11 without forming an opening portion 31 in an area other than a mounting area of the heating element H1, while suppressing interference between the heating elements H1 to H5 and the deformation suppressing portion 30B. Consequently, as compared to a case where an opening portion 31 is formed in all the mounting areas of the heating elements H1 to H5, it is possible to enhance rigidity of the deformation suppressing portion 30B.

Note that, in the example illustrated in FIGS. 21 and 22, five heating elements H1 to H5 are provided. An example embodiment, however, is not limited to the above. Further, two recess portions 32 are formed. Alternatively, the number of recess portions 32 may be one, or three or more. Further, in the example illustrated in FIGS. 21 and 22, one opening portion 31 is formed. Alternatively, a plurality of opening portions 31 may be formed, when it is possible to secure rigidity of the deformation suppressing portion 30B.

The deformation suppressing portion 30B is mounted on the circuit board 10 by an adhesive agent, a screw, or the like, for example. As a material of the deformation suppressing portion 30B, iron, stainless alloy, or the like is used, for example. Further, the deformation suppressing portion 30B is formed in such a way that at least rigidity capable of withstanding a pressure generated when the coolant COO turns from a liquid-phase coolant LP-COO to a gas-phase coolant GP-COO by phase change is secured, as the weights of the coolant COO, the heating elements H1 to H5, the first housing 20, and the like are added.

A configuration of the electronic equipment 100DD is described as above. The electric equipment 100DD in the second example embodiment of the present invention is able to provide an advantageous effect similar to the electronic equipment 100D.

Third Example Embodiment

A configuration of electronic equipment 100E in a third example embodiment of the present invention is described, based on the drawings.

Figure 23:
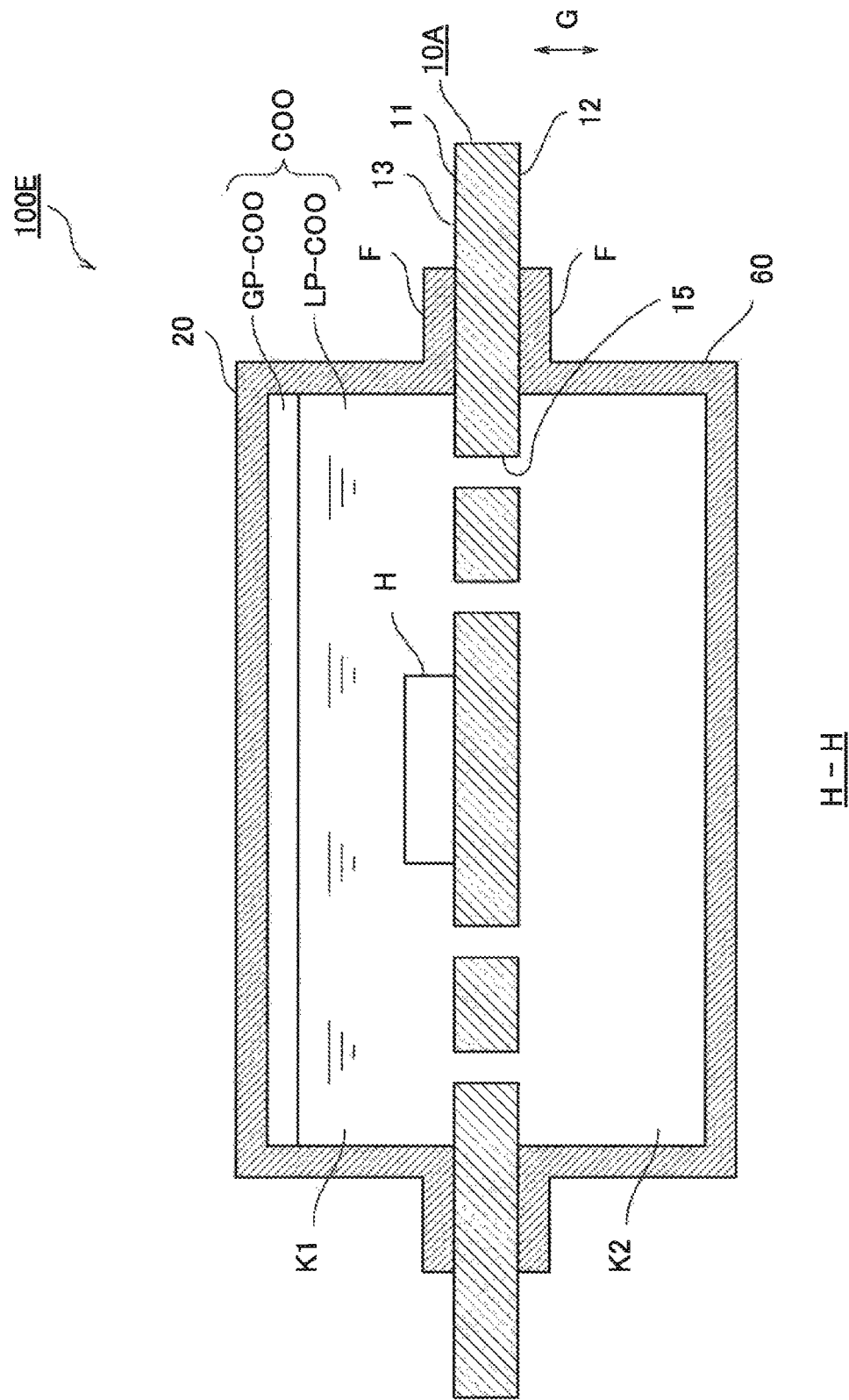
FIG. 23 is a cross-sectional view illustrating a configuration of electronic equipment in a third example embodiment of the present invention, and is a diagram illustrating a cross section taken along the plane H-H in FIG. 25.
Figure 24:
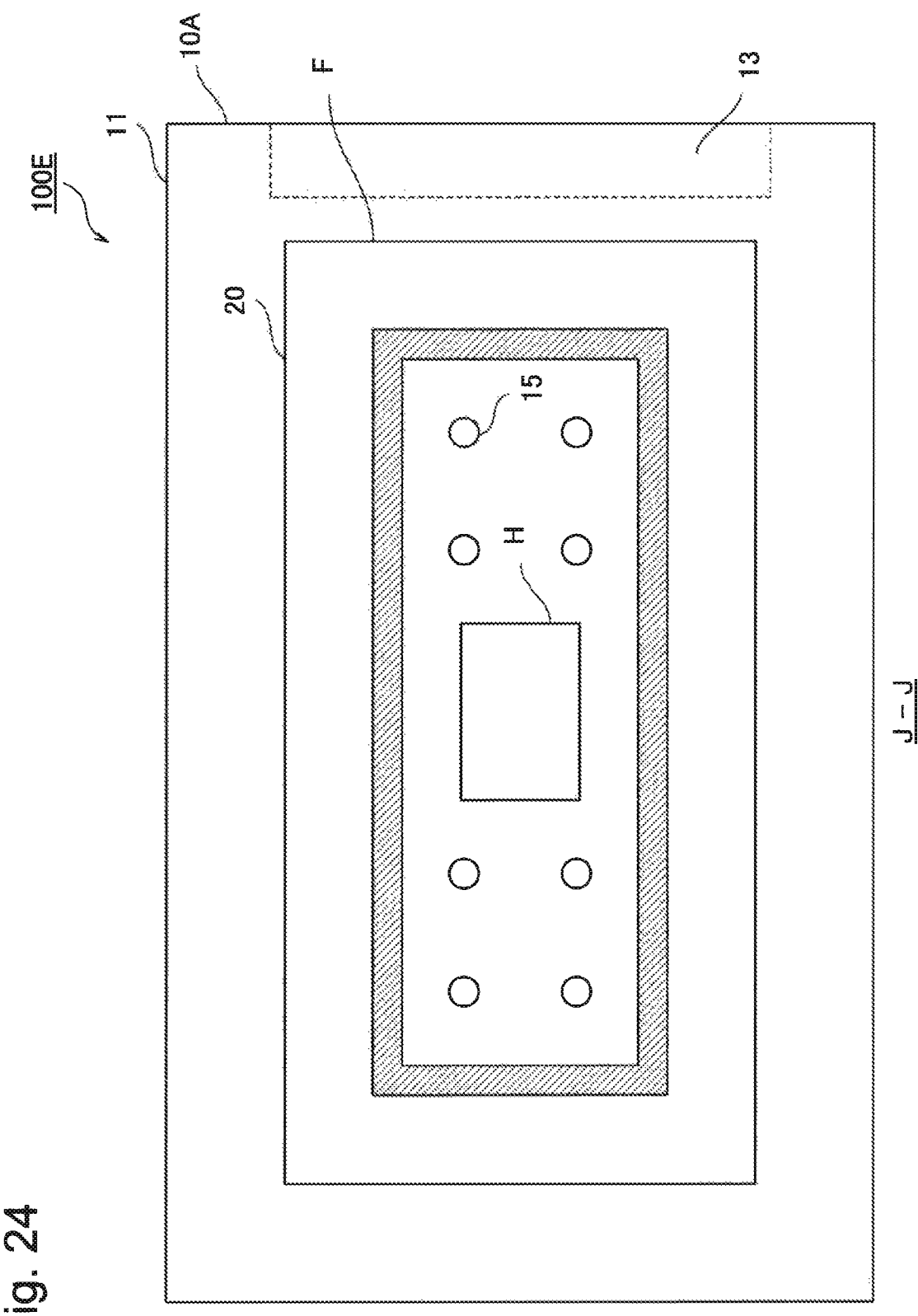
FIG. 24 is a cross-sectional view illustrating a configuration of the electronic equipment in the third example embodiment of the present invention, and is a diagram illustrating a cross section taken along the plane J-J in FIG. 25.
Figure 25:
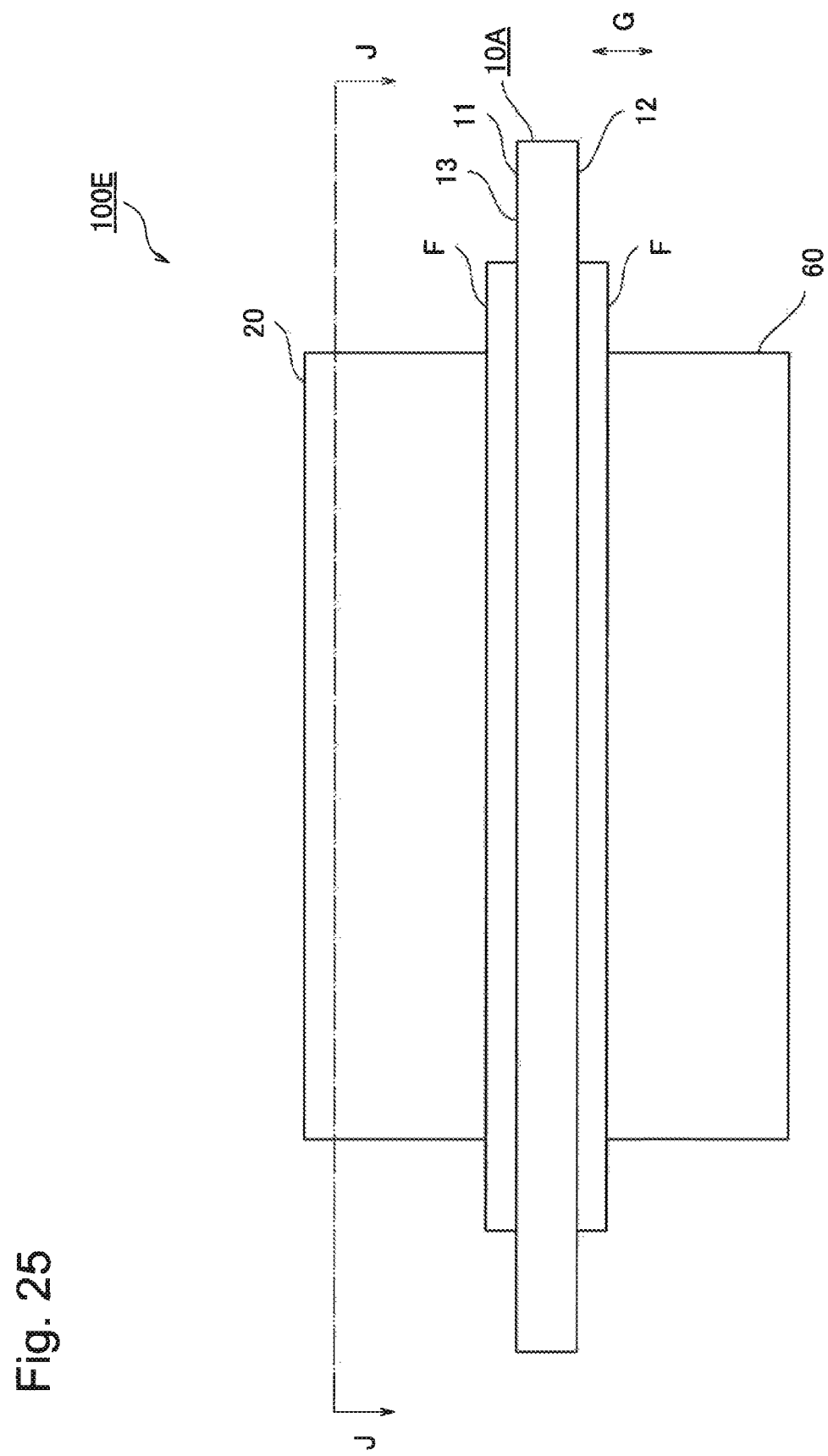
FIG. 25 is a side view illustrating a configuration of the electronic equipment in the third example embodiment of the present invention.
Figure 26:
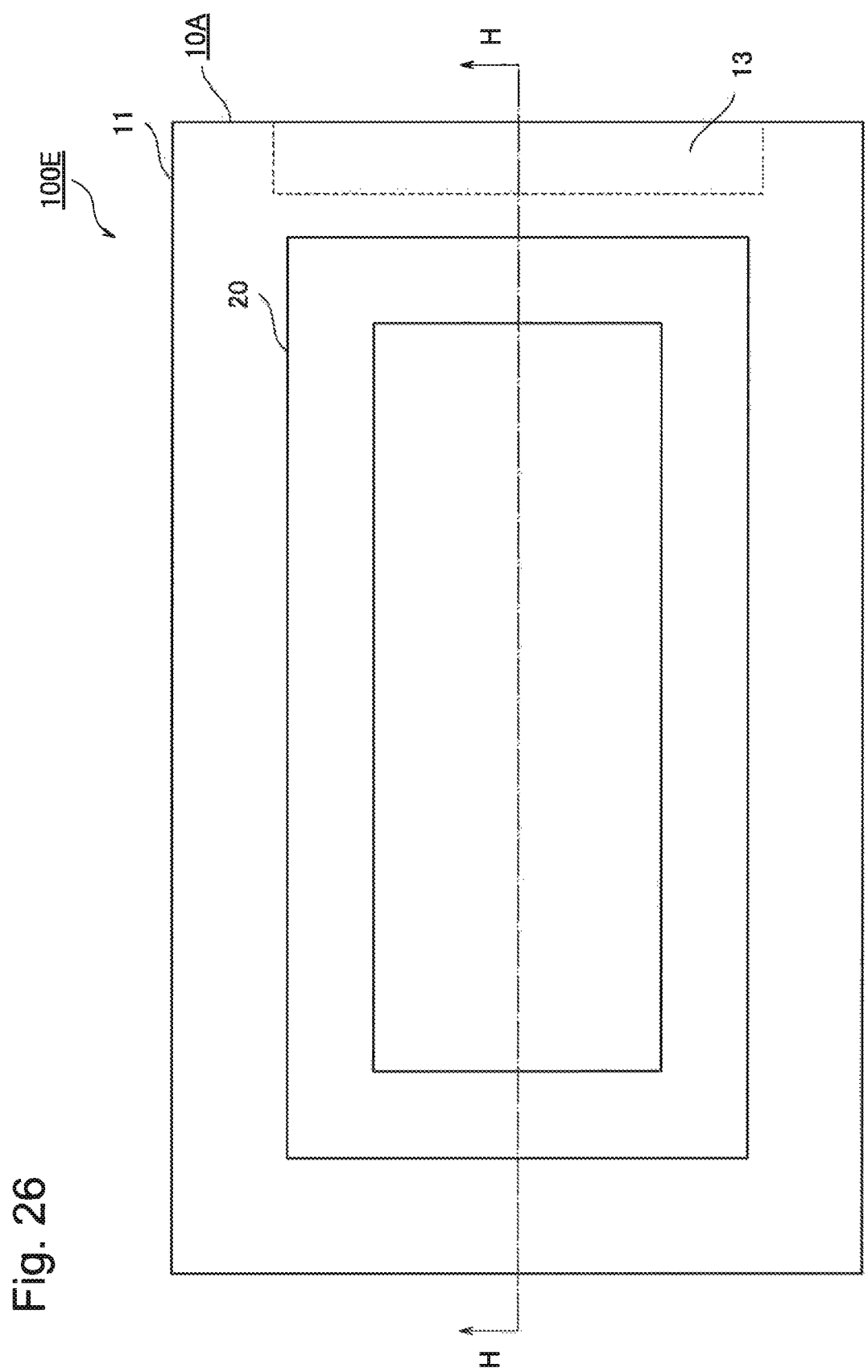
FIG. 26 is a top plan view illustrating a configuration of the electronic equipment in the third example embodiment of the present invention.

FIG. 23 is a cross-sectional view illustrating a configuration of the electronic equipment 100E, and is a diagram illustrating a cross section taken along the plane H-H in FIG. 26. FIG. 24 is a cross-sectional view illustrating a configuration of the electronic equipment 100E, and is a diagram illustrating a cross section taken along the plane J-J in FIG. 25. FIG. 25 is a side view illustrating a configuration of the electronic equipment 100E. FIG. 26 is a top plan view illustrating a configuration of the electronic equipment 100E.

Note that, in FIGS. 23 and 25, a vertical direction G is illustrated. Further, in FIGS. 23 to 26, constituent elements equivalent to respective constituent elements illustrated in FIGS. 1 to 22 are indicated with same reference numbers as the reference numbers illustrated in FIGS. 1 to 22.

Referring to FIGS. 23 to 26, the electronic equipment 100E includes a circuit board 10A, a first housing 20, and a second housing 60. The electronic equipment 100E is able to be mounted to an accommodation rack 200 similarly to the electronic equipment 100. Note that the electronic equipment 100E may be used as an electronic module to be incorporated in a communication device, a server, or the like, for example.

Herein, comparison is made between the electronic equipment 100E and the electronic equipment 100. As illustrated in FIG. 23, the electronic equipment 100E is different from the electronic equipment 100 in a point that the second housing 60 is further included. Further, the electronic equipment 100E is different from the electronic equipment 100 in a point that a through-hole 15 is formed in the circuit board 10A.

As illustrated in FIG. 23, the second housing 60 is mounted on a second main surface 12 of the circuit board 10A in such a way that a heating element H and a coolant COO are sealed with respect to the second main surface 12. Further, the second housing 60 is mounted on the second main surface 12 in such a way as not to cover a back surface of a connector portion 13.

The second housing 60 is mounted on the second main surface 12 in such a way that at least an area associated with a mounting area of the heating element H is included in the second main surface 12 with respect to the second main surface 12 of the circuit board 10A. In addition to the above, the second housing 60 is mounted on the second main surface 12 in such a way that the coolant COO is sealed with respect to the first housing 20 via the circuit board 10A.

Further, the second housing 60 includes a flange portion F similarly to the first housing 20. As illustrated in FIG. 23, the flange portion F is formed in such a way as to project from an outer periphery of a lateral surface of the second housing 60. As a material of the second housing 60, a thermal conductive material is used, and aluminum, aluminum alloy, or the like is used, for example.

Note that the second housing 60 is mounted on the second main surface 12 of the circuit board 10A by an adhesive agent, a screw, or the like, for example. At this occasion, the flange portion F of the second housing 60, and the second main surface 12 of the circuit board 10A are joined by an adhesive agent, a screw, or the like. Note that, preferably, a rubber-like packing or the like is interposed, as an elastic member, between the flange portion F of the second housing 60 and the second main surface 12 of the circuit board 10A. Thus, it is possible to suppress formation of a gap between the flange portion F of the second housing 60 and the second main surface 12 of the circuit board 10A. Consequently, it is possible to suppress leakage of the coolant COO from between the flange portion F of the second housing 60 and the second main surface 12 of the circuit board 10A.

Note that the flange portion F of the second housing 60 is not an essential element similarly to the flange portion F of the first housing 20, and may be omitted. In this case, an upper side end portion (a lower side end portion on the plane of FIG. 23) of a lateral surface of the second housing 60 in the vertical direction G, and the second main surface 12 of the circuit board 10A are joined by an adhesive agent or the like.

The circuit board 10A includes the through-hole 15. The through-hole 15 is formed in such a way as to pass through the first main surface 11 and the second main surface 12 of the circuit board 10A. Specifically, the through-hole 15 is formed in the circuit board 10A in such a way that the coolant COO is allowed to flow between a first space K1 formed between the first main surface 11 and the first housing 20, and a second space K2 formed between the second main surface 12 and the second housing 60. Thus, the coolant COO is allowed to flow between the first space K1 (first main surface 11 side) and the second space K2 (second main surface 12 side).

Note that the through-hole 15 also functions as a connection portion for connecting the first space K1 and the second space K2. Further, the through-hole 15 also functions as a deformation suppressing portion for suppressing deformation of the circuit board 10A.

By forming the through-hole 15 as a deformation suppressing portion and a connection portion, as described above, the coolant COO is allowed to flow between the first space K1 (first main surface 11 side) and the second space K2 (second main surface 12 side).

Thus, it is possible to reduce the weight and a pressure of the coolant COO applied to the circuit board 10A. Consequently, the through-hole 15 is able to suppress deformation due to the weight or a pressure of the coolant COO. Further, it is possible to adjust the size or the number of through-holes 15 in such a way that the circuit board 10A does not reach an elastic limit by a pressure generated when the coolant COO turns from a liquid-phase coolant LP-COO to a gas-phase coolant GP-COO by phase change, as the weights of the coolant COO, the heating element H, the first housing 20, and the like are added.

The coolant COO is sealed in a sealed state in a space between the first housing 20 and the second housing 60 joined via the circuit board 10A. Therefore, injecting a liquid-phase coolant LP-COO into a space (the first space K1 and the second space K2) between the first housing 20 and the second housing 60, followed by evacuation, constantly keeps the pressure of the space between the first housing 20 and the second housing 60 to a saturated steam pressure of the coolant COO. Note that a method for filling the space between the first housing 20 and the second housing 60 with the coolant COO will be described later in detail in description of a manufacturing method of the electronic equipment 100E.

A configuration of the electronic equipment 100E is described as above.

Next, a manufacturing method of the electronic equipment 100E is described.

First, the circuit board 10A on which the heating element H is mounted is prepared. Next, the first housing 20 is mounted on the first main surface 11 of the circuit board 10A by an adhesive agent, a screw, or the like. Further, the second housing 60 is mounted on the second main surface 12 of the circuit board 10A by an adhesive agent, a screw or the like. Then, the coolant COO is filled in the space between the first housing 20 and the second housing 60.

A method for filling the space between the first housing 20 and the second housing 60 with the coolant COO is as follows.

For example, the coolant COO is injected into a space (first space K1) between the first housing 20 and the circuit board 10A through a coolant injection hole (not illustrated), which is formed in advance in an upper surface of the first housing 20 (a surface on the upper side on the plane of FIG. 21). Since the through-hole 15 is formed in the circuit board 10A, the coolant COO flows into a space (second space K2) between the second housing 60 and the circuit board 10A via the through-hole 15 by a gravitational force. Then, when the coolant COO reaches a predetermined amount, the coolant injection hole is closed.

Further, air is ejected from a space (the first space K1 and the second space K2) between the first housing 20 and the second housing 60 by using a vacuum pump (not illustrated) or the like via an air ejection hole (not illustrated), which is formed in advance in the upper surface of the first housing 20 (a surface on the upper side on the plane of FIG. 21). Then, the air ejection hole is closed. In this way, the coolant COO is sealed in the space between the first housing 20 and the second housing 60. Thus, the pressure of the space between the first housing 20 and the second housing 60 becomes equal to a saturated steam pressure of the coolant COO, and a boiling point of the coolant COO sealed in the space between the first housing 20 and the second housing 60 approaches a room temperature. Note that the coolant injection hole may also be used as the air ejection hole.

A manufacturing method of the electronic equipment 100E is described as above.

Next, an operation of the electronic equipment 100E is described. When the heating element H on the circuit board 10A is heated, a liquid-phase coolant LP-COO is boiled by the heat of the heating element H on the surface of the heating element H, and turns to a gas-phase coolant GP-COO by phase change. Thus, air bubbles of the gas-phase coolant GP-COO are generated. The heat generated on the heating element H is dissipated by the heat of vaporization (latent heat) generated by the phase change. Consequently, the heating element H is cooled.

The gas-phase coolant GP-COO rises upward in the vertical direction G within the liquid-phase coolant LP-COO, escapes from a liquid surface of the liquid-phase coolant LP-COO, and further rises upward in the vertical direction G. Further, when the gas-phase coolant GP-COO boiled by the heat of the heating element H is cooled by contact with an inner wall surface of the first housing 20, the gas-phase coolant GP-COO turns to the liquid-phase coolant LP-COO again by phase change. The liquid-phase coolant LP-COO falls downward in the vertical direction G within the first housing 20, stays on the second housing 60 side, and is used again for cooling the heating element H.

Herein, the through-hole 15 as a deformation suppressing portion and a connection portion is formed in the circuit board 10A. Thus, as described above, the coolant COO is allowed to flow between the first space K1 (first main surface 11 side) and the second space K2 (second main surface 12 side). Therefore, it is possible to reduce a pressure difference between the first space K1 and the second space K2.

Accordingly, it is possible to reduce the weight or a pressure of the coolant COO applied to the circuit board 10A. Consequently, the through-hole 15 is able to suppress deformation due to the weight or a pressure of the coolant COO. Further, since it is possible to suppress deformation of the circuit board 10A, it is possible to suppress formation of a gap between the circuit board 10A and the first housing 20 at a joint portion between the circuit board 10A and the first housing 20.

Therefore, even when the heating element H and the coolant COO are sealed in a space surrounded by the circuit board 10A and the first housing 20, it is possible to suppress a failure such as leakage of the coolant COO or cutting of a wiring formed on the circuit board.

Figure 27:
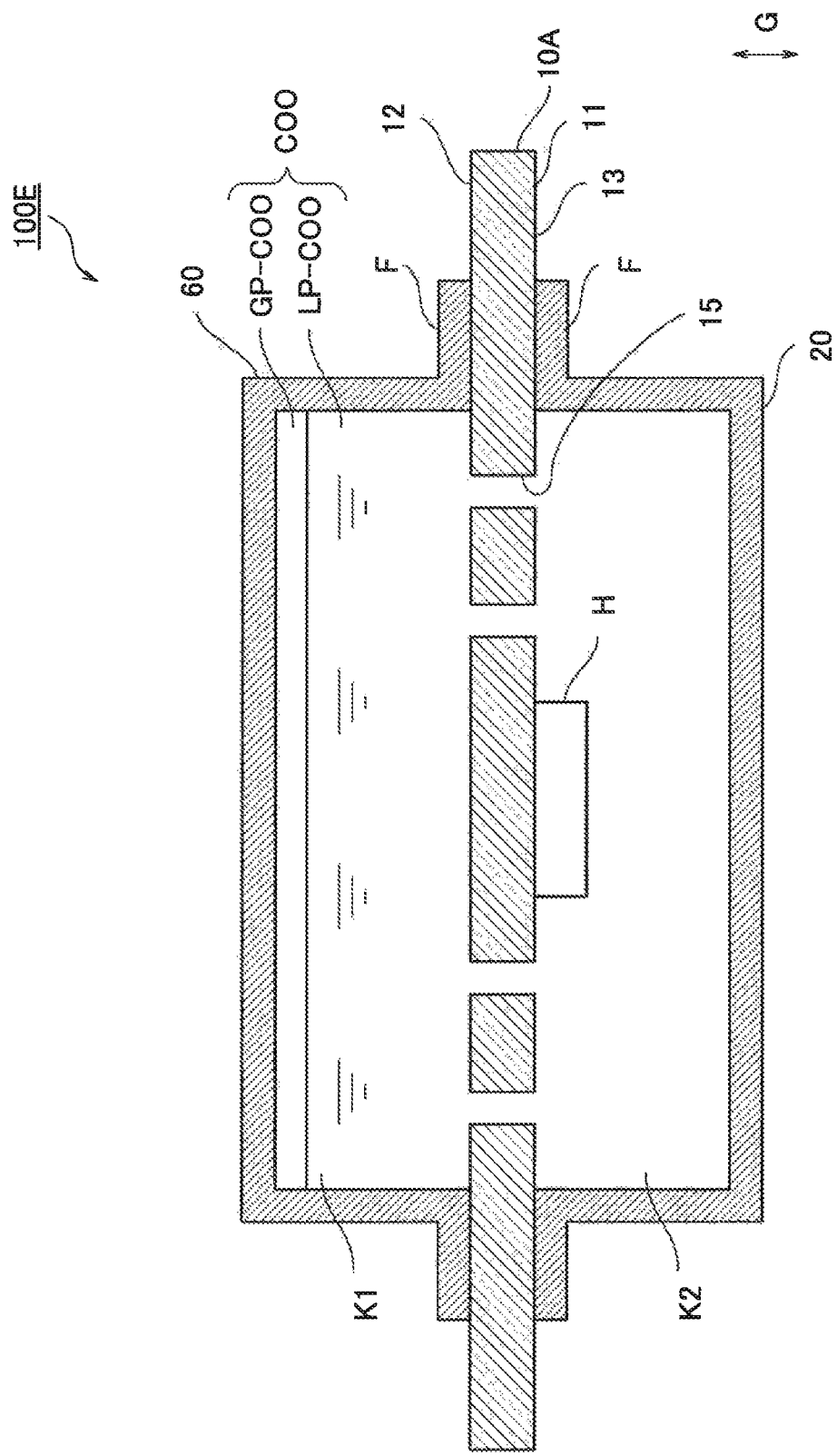
FIG. 27 is a cross-sectional view illustrating a configuration of the electronic equipment in the third example embodiment of the present invention, and is a diagram when the electronic equipment is set in such a way that a second housing is disposed on the upper side in a vertical direction.
Figure 28:
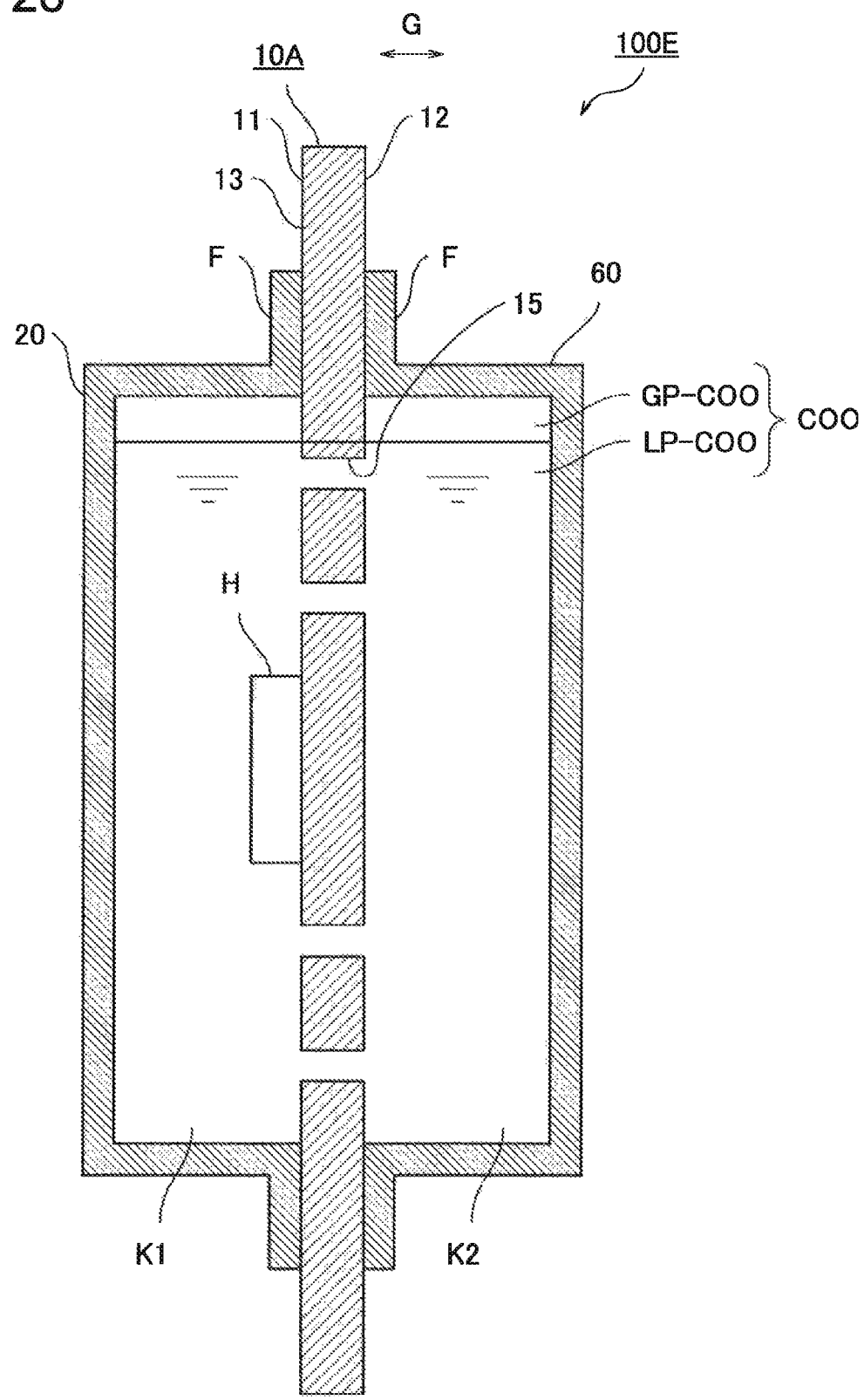
FIG. 28 is a cross-sectional view illustrating a configuration of the electronic equipment in the third example embodiment of the present invention, and is a diagram when the electronic equipment is set in such a way that a circuit board is disposed along the vertical direction.

Next, a case where a posture of the electronic equipment 100E is changed is described by using FIGS. 27 and 28.

FIG. 27 is a cross-sectional view illustrating a configuration of the electronic equipment 100E, and is a diagram when the electronic equipment 100E is set in such a way that the second housing 60 is disposed on the upper side in the vertical direction G.

As illustrated in FIG. 27, even when the electronic equipment 100E is set in such a way that the second housing 60 is disposed on the upper side in the vertical direction G, the coolant COO is allowed to flow between the first space K1 (first main surface 11 side) and the second space K2 (second main surface 12 side) via the through-hole 15. Therefore, it is possible to reduce a pressure difference between the first space (first main surface 11 side) and the second space K2 (second main surface 12 side).

FIG. 28 is a cross sectional view illustrating a configuration of the electronic equipment 100E, and is a diagram when the electronic equipment 100E is set in such a way that the circuit board 10A is disposed along the vertical direction G.

As illustrated in FIG. 28, even when the electronic equipment 100E is set in such a way that the circuit board 10A is disposed along the vertical direction G, the coolant COO is allowed to flow between the first space K1 (first main surface 11 side) and the second space K2 (second main surface 12 side) via the through-hole 15. Therefore, it is possible to reduce a pressure difference between the first space K1 (first main surface 11 side) and the second space K2 (second main surface 12 side).

As described above, even when the electronic equipment 100E is set to a posture as illustrated in FIGS. 27 and 28, it is possible to reduce a pressure difference between the first space K1 (first main surface 11 side) and the second space K2 (second main surface 12 side). Therefore, even when the electronic equipment 100E is set to a posture as illustrated in FIGS. 27 and 28, it is possible to reduce the weight or a pressure of the coolant COO applied to the circuit board 10A. Consequently, the through-hole 15 is able to suppress deformation due to the weight or a pressure of the coolant COO.

As described above, the electronic equipment 100E in the third example embodiment of the present invention further includes the second housing 60. The second housing 60 is mounted on the second main surface 12 in such a way that at least an area associated with the heating element H is included in the second main surface 12 with respect to the second main surface 12 being a main surface of the circuit board 10A on a side opposite to the first main surface 11, and the coolant COO is sealed with respect to the first housing 20 via the circuit board 10A. Further, a deformation suppressing portion is a connection portion for connecting the first space K1 formed between the first main surface 11 of the circuit board 10A and the first housing 20, and the second space K2 formed between the second main surface 12 of the circuit board 10A and the second housing 60 in such a way that a coolant is allowed to flow between the first space K1 and the second space K2.

In this way, by further providing the second housing 60, it is possible to form the first space K1 formed between the first main surface 11 of the circuit board 10A and the first housing 20, and the second space K2 formed between the second main surface 12 of the circuit board 10A and the second housing 60. At this occasion, a connection portion for connecting the first space K1 and the second space k2 is provided in such a way that a coolant is allowed to flow between the first space K1 and the second space K2. Therefore, it is possible to reduce a pressure difference between the first space K1 and the second space K2.

Accordingly, it is possible to reduce the weight or a pressure of the coolant COO applied to the circuit board 10A. Consequently, the connection portion is able to suppress deformation due to the weight or a pressure of the coolant COO. Further, since it is possible to suppress deformation of the circuit board 10A, it is possible to suppress formation of a gap between the circuit board 10A and the first housing 20 at a joint portion between the circuit board 10A and the first housing 20. Likewise, it is possible to suppress formation of a gap between the circuit board 10A and the second housing 60 at a joint portion between the circuit board 10A and the second housing 60.

In the electronic equipment 100E in the third example embodiment of the present invention, a connection portion is the through-hole 15, which is formed in the circuit board 10A, in such a way that the coolant COO is allowed to flow between the first space K1 and the second space K2. Thus, the coolant COO is allowed to flow between the first space K1 and the second space K2 via the through-hole 15 of the circuit board 10A. Therefore, it is possible to reduce a pressure difference between the first space K1 and the second space K2.

Accordingly, it is possible to reduce the weight or a pressure of the coolant COO applied to the circuit board 10A. Consequently, the through-hole 15 is able to suppress deformation of the circuit board 10A due to the weight or a pressure of the coolant COO. Further, since it is possible to suppress deformation of the circuit board 10A, it is possible to suppress formation of a gap between the circuit board 10A and the first housing 20 at a joint portion between the circuit board 10A and the first housing 20. Likewise, it is possible to suppress formation of a gap between the circuit board 10A and the second housing 60 at a joint portion between the circuit board 10A and the second housing 60.

Fourth Example Embodiment

A configuration of electronic equipment 100F in a fourth example embodiment of the present invention is described, based on the drawings.

Figure 29:
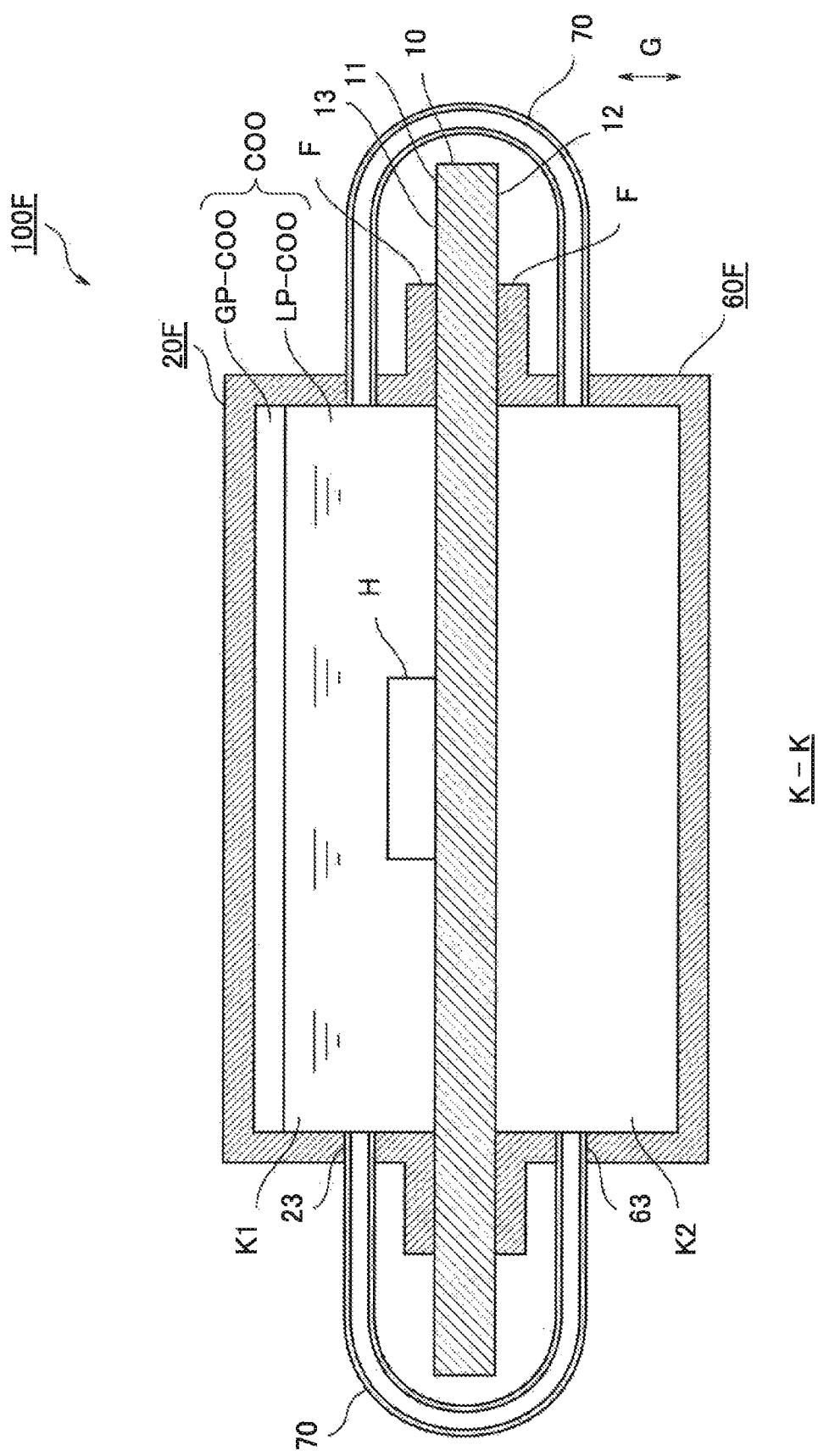
FIG. 29 is a cross-sectional view illustrating a configuration of electronic equipment in a fourth example embodiment of the present invention, and is a diagram illustrating a cross section taken along the plane K-K in FIG. 32.
Figure 30:
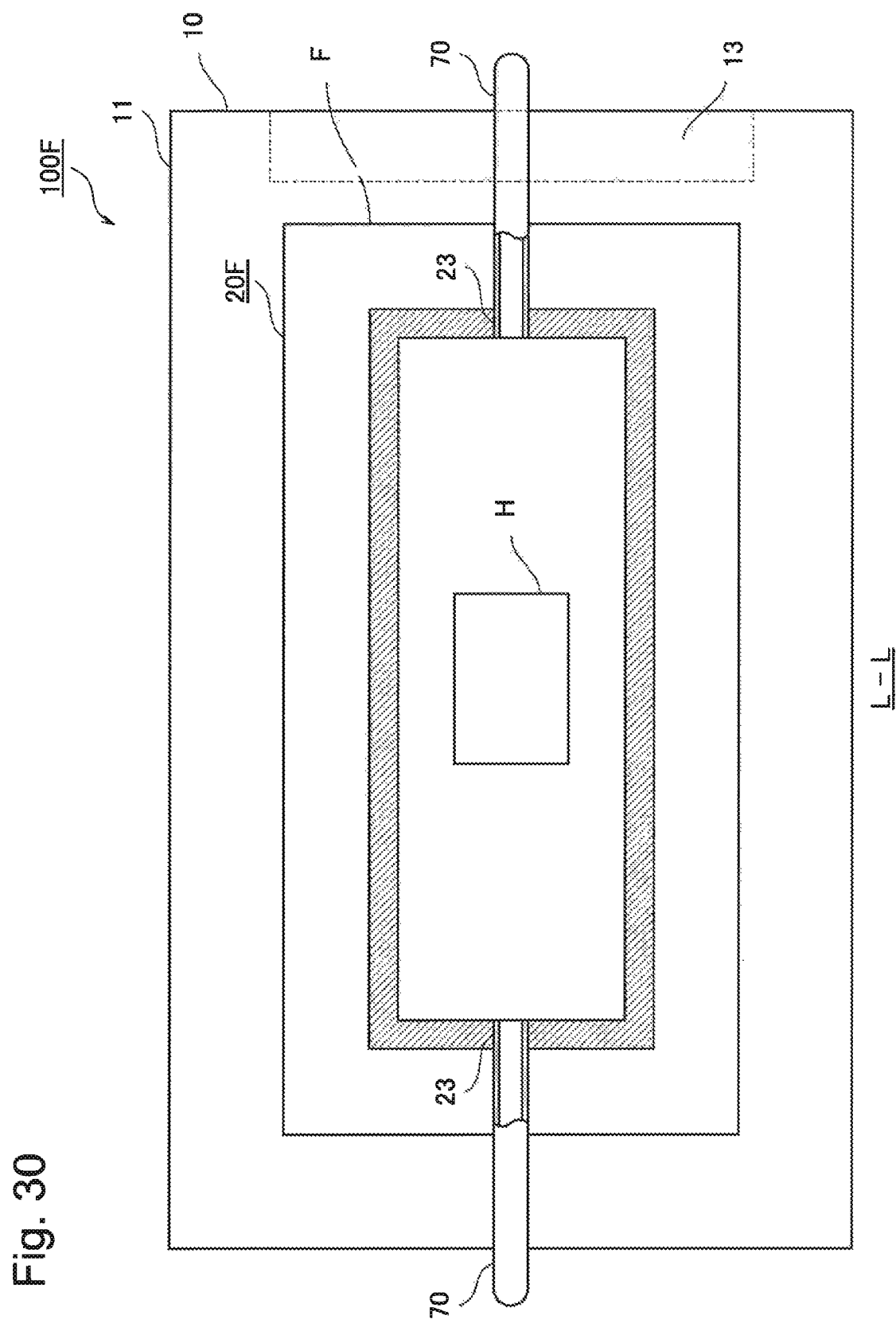
FIG. 30 is a cross-sectional view illustrating a configuration of the electronic equipment in the fourth example embodiment of the present invention, and is a diagram illustrating a cross section taken along the plane L-L in FIG. 31.
Figure 31:
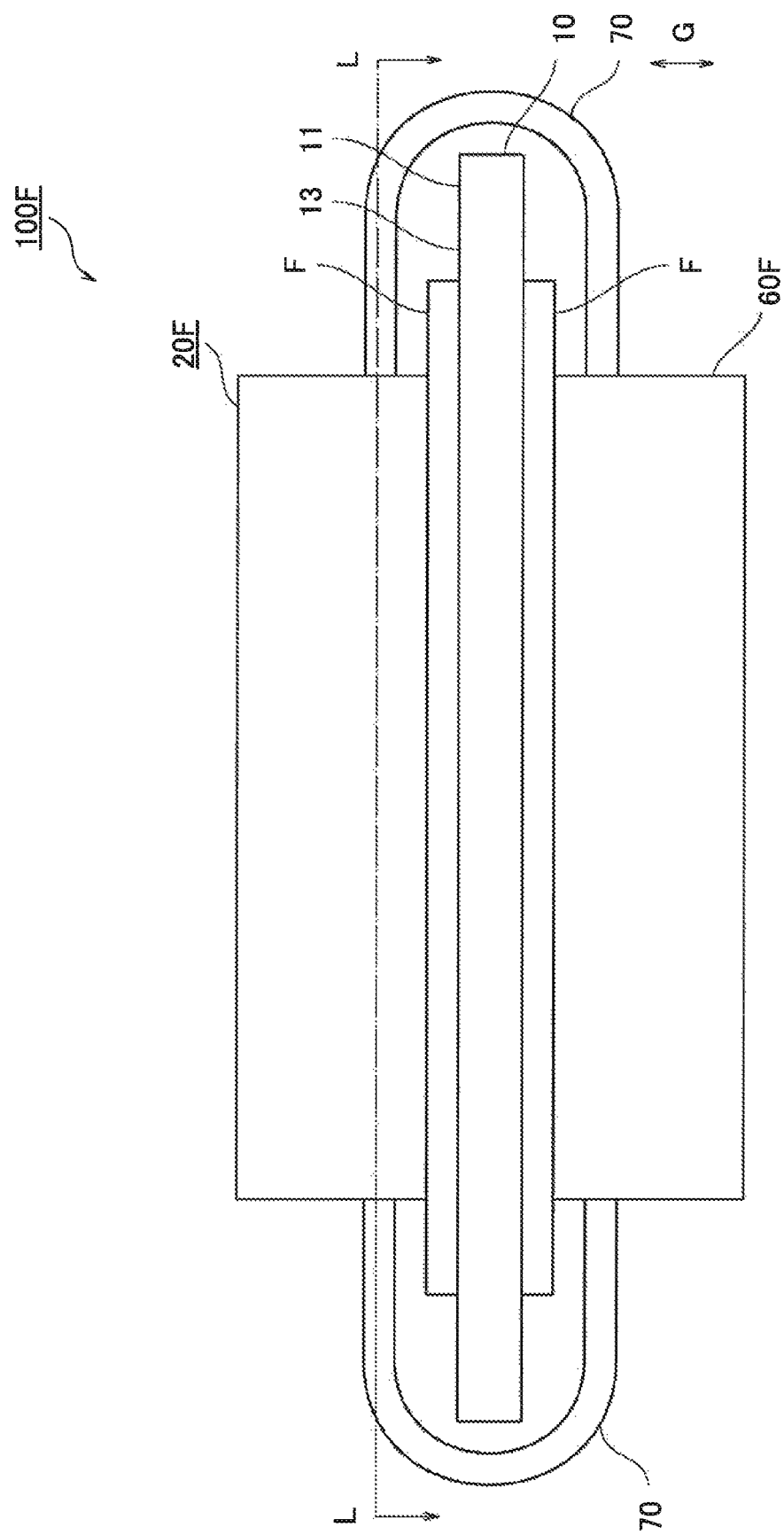
FIG. 31 is a side view illustrating a configuration of the electronic equipment in the fourth example embodiment of the present invention.
Figure 32:
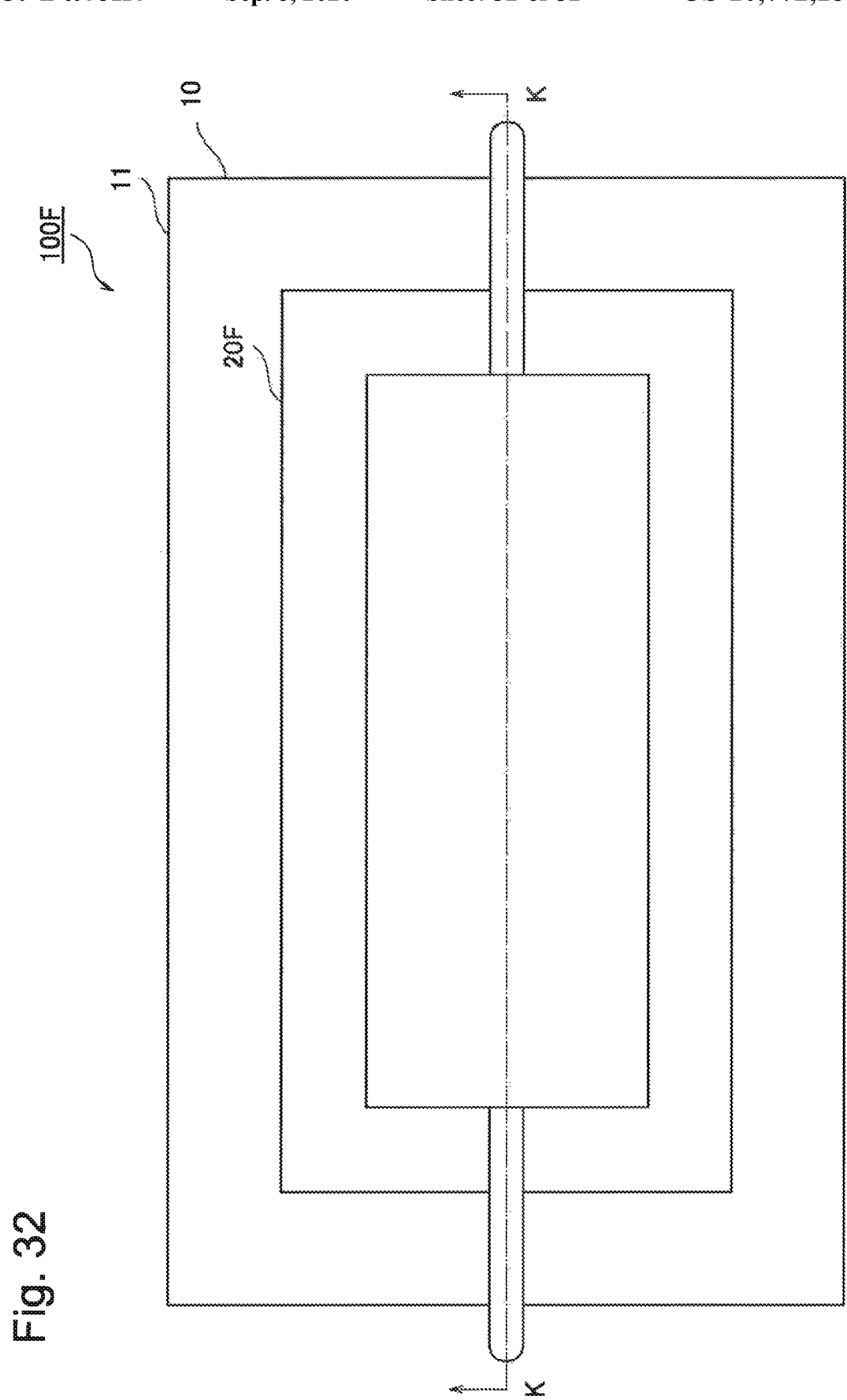
FIG. 32 is a top plan view illustrating a configuration of the electronic equipment in the fourth example embodiment of the present invention.

FIG. 29 is a cross-sectional view illustrating a configuration of the electronic equipment 100F, and is a diagram illustrating a cross section taken along the plane K-K in FIG. 32. FIG. 30 is a cross-sectional view illustrating a configuration of the electronic equipment 100F, and is a diagram illustrating a cross section taken along the plane L-L in FIG. 31. FIG. 31 is a side view illustrating a configuration of the electronic equipment 100F. FIG. 32 is a top plan view illustrating a configuration of the electronic equipment 100F.

Note that, in FIGS. 29 and 31, a vertical direction G is illustrated. Further, in FIGS. 29 to 32, constituent elements equivalent to respective constituent elements illustrated in FIGS. 1 to 28 are indicated with same reference numbers as the reference numbers illustrated in FIGS. 1 to 28.

Referring to FIGS. 29 to 32, the electronic equipment 100F includes a circuit board 10, a first housing 20F, a second housing 60F, and a pipe unit 70. The electronic equipment 100F is able to be mounted to an accommodation rack 200 similarly to the electronic equipment 100. Note that the electronic equipment 100F may be used as an electronic module to be incorporated in a communication device, a server, or the like, for example.

Herein, comparison is made between the electronic equipment 100F and the electronic equipment 100. As illustrated in FIG. 29, the electronic equipment 100F is different from the electronic equipment 100 in a point that the second housing 60F and the pipe unit 70 are further provided.

Further, comparison is made between the electronic equipment 100F and the electronic equipment 100E. As illustrated in FIG. 29, the electronic equipment 100F is different from the electronic equipment 100E in a point that the pipe unit 70 is further provided. Note that, in FIG. 29, two pipe units 70 are provided. An example embodiment, however, is not limited to the above. Specifically, one or three or more pipe units 70 may be provided.

Referring to FIGS. 29 to 32, the pipe unit 70 is connected to the first housing 20F and the second housing 60F. Specifically, one end portion of the pipe unit 70 is connected to an opening portion 23 of the first housing 20F. The other end portion of the pipe unit 70 is connected to an opening portion 63 of the second housing 60F.

The pipe unit 70 as a deformation suppressing portion and a connection portion connects between a first space K1 and a second space K2 in such a way that a coolant COO is allowed to flow between the first space K1 and the second space K2. Note that, in the electronic equipment 100F, the first space K1 is a space formed between a first main surface 11 of the circuit board 10 and the first housing 20F. Further, the second space K2 is a space formed between a second main surface 12 of the circuit board 10 and the second housing 60F.

Herein, the pipe unit 70 as a deformation suppressing portion and a connection portion is provided. Thus, as described above, the coolant COO is allowed to flow between the first space K1 (first main surface 11 side) and the second space K2 (second main surface 12 side). Therefore, it is possible to reduce a pressure difference between the first space K1 and the second space K2.

Accordingly, it is possible to reduce the weight or a pressure of the coolant COO applied to the circuit board 10. Consequently, the pipe unit 70 is able to suppress deformation due to the weight or a pressure of the coolant COO. Further, since it is possible to suppress deformation of the circuit board 10, it is possible to suppress formation of a gap between the circuit board 10 and the first housing 20F at a joint portion between the circuit board 10 and the first housing 20F. Likewise, it is possible to suppress formation of a gap between the circuit board 10 and the second housing 60F at a joint portion between the circuit board 10 and the second housing 60F.

Therefore, even when a heating element H and the coolant COO are sealed in a space surrounded by the first housing 20F and the second housing 60F, it is possible to suppress a failure such as leakage of the coolant COO or cutting of a wiring formed on the circuit board.

As described above, in the electronic equipment 100F in the fourth example embodiment of the present invention, a connection portion is the pipe unit 70 for connecting the first space K1 and the second space K2 in such a way that the coolant COO is allowed to flow between the first space K1 and the second space K2. Thus, the coolant COO is allowed to flow between the first space K1 and the second space K2 via the pipe unit 70. Therefore, it is possible to reduce a pressure difference between the first space K1 and the second space K2.

Accordingly, it is possible to reduce the weight or a pressure of the coolant COO applied to the circuit board 10. Consequently, the pipe unit 70 is able to suppress deformation due to the weight or a pressure of the coolant COO. Further, since it is possible to suppress deformation of the circuit board 10, it is possible to suppress formation of a gap between the circuit board 10 and the first housing 20F at a joint portion between the circuit board 10 and the first housing 20F. Likewise, it is possible to suppress formation of a gap between the circuit board 10 and the second housing 60F at a joint portion between the circuit board 10 and the second housing 60F.

A part or the entirety of the above-described example embodiments may be described as the following supplementary notes, but are not limited to the following.

[Supplementary Note 1]
Electronic equipment including:
a circuit board on which a heating element is mounted;
a first housing mounted on a first main surface of the circuit board in such a way that the heating element and a coolant are sealed with respect to the first main surface; and
a deformation suppressing portion which suppresses deformation of the circuit board.

[Supplementary Note 2]
The electronic equipment according to supplementary note 1, wherein
the coolant is capable of turning to a liquid-phase coolant and a gas-phase coolant by phase change.

[Supplementary Note 3]
The electronic equipment according to supplementary note 1 or 2, wherein
the deformation suppressing portion is a plate member mounted on one or both of the first main surface, and a second main surface being a main surface of the circuit board on a side opposite to the first main surface.

[Supplementary Note 4]
The electronic equipment according to supplementary note 3, wherein
a plate member mounted on the first main surface is provided in such a way as not to cover a mounting area of the heating element in the first main surface.

[Supplementary Note 5]
The electronic equipment according to any one of supplementary notes 1 to 4, wherein
the first housing is configured to include a lid portion which faces the first main surface of the circuit board, and a frame portion which surrounds an outer peripheral portion of the lid portion.

[Supplementary Note 6]
The electronic equipment according to supplementary note 5, further including
an elastic member provided between the lid portion and the frame portion, wherein
the heating element and a coolant are sealed between the first main surface of the circuit board and the first housing by compressing the elastic member between the lid portion and the frame portion.

[Supplementary Note 7]
The electronic equipment according to any one of supplementary notes 1 to 6, further including
a heat radiating portion mounted to the first housing.

[Supplementary Note 8]
The electronic equipment according to supplementary note 7, wherein
a circulation path is formed inside the heat radiating portion in such a way that the coolant is allowed to circulate.

[Supplementary Note 9]
The electronic equipment according to any one of supplementary notes 1 to 8, further including
a connector portion provided on the circuit board, and connected to another electronic component, wherein
the first housing is mounted on the first main surface in such a way as not to cover the connector portion.

[Supplementary Note 10]
The electronic equipment according to supplementary note 1 or 2, further including
a second housing mounted on a second main surface being a main surface of the circuit board on a side opposite to the first main surface in such a way that at least an area associated with a mounting area of the heating element is included in the second main surface, and the coolant is sealed with respect to the first housing via the circuit board, wherein
the deformation suppressing portion is a connection portion which connects a first space formed between the first main surface of the circuit board and the first housing, and a second space formed between the second main surface and the second housing in such a way that the coolant is allowed to flow between the first space and the second space.

[Supplementary Note 11]
The electronic equipment according to supplementary note 10, wherein
the connection portion is a through-hole formed in the circuit board in such a way that the coolant is allowed to flow between the first space and the second space.

[Supplementary Note 12]
The electronic equipment according to supplementary note 10, wherein
the connection portion is a pipe unit which connects between the first space and the second space in such a way that the coolant is allowed to flow between the first space and the second space.

[Supplementary Note 13]

An electronic device including the electronic equipment according to any one of supplementary notes 1 to 12; and an accommodation rack to which the electronic equipment is mounted.

[Supplementary Note 14]

An electronic device including:

the electronic equipment according to supplementary note 9; and an accommodation rack including an accommodation-rack-side connector portion connected to the connector portion, wherein the electronic equipment is mounted to the accommodation rack.

In the foregoing, the invention of the present application is described by referring to example embodiments. The invention of the present application, however, is not limited to the above-described example embodiments. A configuration and details of the invention of the present application may be modified in various ways comprehensible to a person skilled in the art within the scope of the invention of the present application.

REFERENCE SIGNS LIST 10, 10A Circuit board
11 First main surface
12 Second main surface
13 Connector portion
15 Through-hole
20, 20A, 20C, 20F First housing
20a Lid portion
20b Frame portion
20c Heat-radiating-function equipped lid portion
21 Heat radiating fin
22 Circulation path
23 Opening portion
30, 30A, 30B Deformation suppressing portion
31 Opening portion
32 Recess portion
40 Heat radiating portion
41 Heat radiating fin
50 Pump
60, 60F Second housing
63 Opening portion
70 Pipe unit
90 Front cover
100, 100A, 100B, 100C, 100D, 100DD Electronic equipment
100E, 100F Electronic equipment
200 Accommodation rack
210 Housing
220 Circuit board
223 Accommodation-rack-side connector portion
1000 Electronic device
F Flange portion
H Heating element
K1 First space
K2 Second space

The invention claimed is:

1. Electronic equipment comprising:

a circuit board on which a heating element is mounted;

a first housing mounted on a first main surface of the circuit board in such a way that the heating element and a coolant are sealed with respect to the first main surface;

a deformation suppressing portion which suppresses deformation of the circuit board; and a second housing mounted on a second main surface of the circuit board, the second main surface being on a side opposite to the first main surface in such a way that at least an area associated with a mounting area of the heating element is included on the second main surface, and the coolant is sealed with respect to the first housing via the circuit board, wherein the deformation suppressing portion is a connection portion which connects a first space formed between the first main surface and the first housing, and a second space formed between the second main surface and the second housing in such a way that the coolant is allowed to flow between the first space and the second space.

2. The electronic equipment according to claim 1, wherein the coolant is capable of turning to a liquid-phase coolant and a gas-phase coolant by phase change.

3. The electronic equipment according to claim 1, wherein the first housing is configured to include a lid portion which faces the first main surface of the circuit board, and a frame portion which surrounds an outer peripheral portion of the lid portion.

4. The electronic equipment according to claim 3, further comprising an elastic member provided between the lid portion and the frame portion, wherein the heating element and the coolant are sealed between the first main surface of the circuit board and the first housing by compressing the elastic member between the lid portion and the frame portion.

5. The electronic equipment according to claim 1, further comprising a heat radiating portion mounted to the first housing.

6. The electronic equipment according to claim 1, further comprising a connector portion provided on the circuit board, and connected to an electronic component, wherein the first housing is mounted on the first main surface in such a way as not to cover the connector portion.

7. An electronic device comprising:

the electronic equipment according to claim 6; and an accommodation rack including an accommodation-rack-side connector portion connected to the connector portion, the electronic equipment being mounted to the accommodation rack.

* * * * *